(12) United States Patent
Chang et al.

(10) Patent No.: US 12,543,352 B2
(45) Date of Patent: Feb. 3, 2026

(54) INTEGRATED CIRCUIT WITH BOTTOM DIELECTRIC INSULATORS AND FIN SIDEWALL SPACERS FOR REDUCING SOURCE/DRAIN LEAKAGE CURRENTS

(71) Applicant: Taiwan Semiconductor Manufacturing Co., Ltd., Hsinchu (TW)

(72) Inventors: Jung-Hung Chang, Hsinchu (TW); Zhi-Chang Lin, Hsinchu (TW); Shih-Cheng Chen, Hsinchu (TW); Tsung-Han Chuang, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 750 days.

(21) Appl. No.: 17/850,811

(22) Filed: Jun. 27, 2022

(65) Prior Publication Data
US 2023/0420513 A1 Dec. 28, 2023

(51) Int. Cl.
*H10D 30/01* (2025.01)
*H10D 30/00* (2025.01)
*H10D 30/43* (2025.01)
*H10D 30/67* (2025.01)
*H10D 62/10* (2025.01)
(Continued)

(52) U.S. Cl.
CPC ......... *H10D 62/121* (2025.01); *H10D 30/014* (2025.01); *H10D 30/43* (2025.01); *H10D 30/501* (2025.01); *H10D 30/6713* (2025.01); *H10D 30/6735* (2025.01); *H10D 30/6757* (2025.01); *H10D 62/115* (2025.01); *H10D 64/017* (2025.01); *H10D 64/021* (2025.01); *H10D 84/0128* (2025.01); *H10D 84/013* (2025.01); *H10D 84/0147* (2025.01);
(Continued)

(58) Field of Classification Search
CPC ..... H10D 30/67; H10D 30/6704–6706; H10D 30/43; H10D 30/47; H10D 30/62; H10D 30/6211; H10D 30/6217; H10D 30/6218; H10D 30/6219; H10D 30/6733; H10D 30/6734; H10D 30/6735; H10D 30/6748; H10D 30/6757; H10D 30/501–509
See application file for complete search history.

(56) References Cited

U.S. PATENT DOCUMENTS 9,236,267 B2  1/2016  De et al.
9,502,265 B1  11/2016  Jiang et al.
(Continued)

FOREIGN PATENT DOCUMENTS

TW  202205460 A  2/2022
TW  202314965 A  4/2023

*Primary Examiner* — Britt D Hanley
*Assistant Examiner* — Jason James Greaving
(74) *Attorney, Agent, or Firm* — Seed IP Law Group

(57) ABSTRACT

An integrated circuit includes a nanostructure transistor including a plurality of first semiconductor nanostructures over a substrate and a source/drain region in contact with each of the semiconductor nanostructures. The integrated circuit includes a fin sidewall spacer laterally bounding a lower portion of the source/drain region. The integrated circuit also includes a bottom isolation structure electrically isolating the source/drain region from the semiconductor substrate.

20 Claims, 13 Drawing Sheets

(51) Int. Cl.
*H10D 64/01* (2025.01)
*H10D 84/01* (2025.01)
*H10D 84/03* (2025.01)
*H10D 84/83* (2025.01)

(52) U.S. Cl.
CPC ....... *H10D 84/0158* (2025.01); *H10D 84/038* (2025.01); *H10D 84/834* (2025.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,431,651 B1 * | 10/2019 | Chao ................. H10D 30/6757 |
| 2020/0105869 A1 * | 4/2020 | Loubet ................ H10D 62/151 |
| 2020/0227305 A1 * | 7/2020 | Cheng ................ H10D 30/6735 |
| 2023/0187551 A1 * | 6/2023 | Cheng ................ H01L 23/5286 257/369 |
| 2023/0343787 A1 * | 10/2023 | Suh ..................... H10D 62/405 |

\* cited by examiner

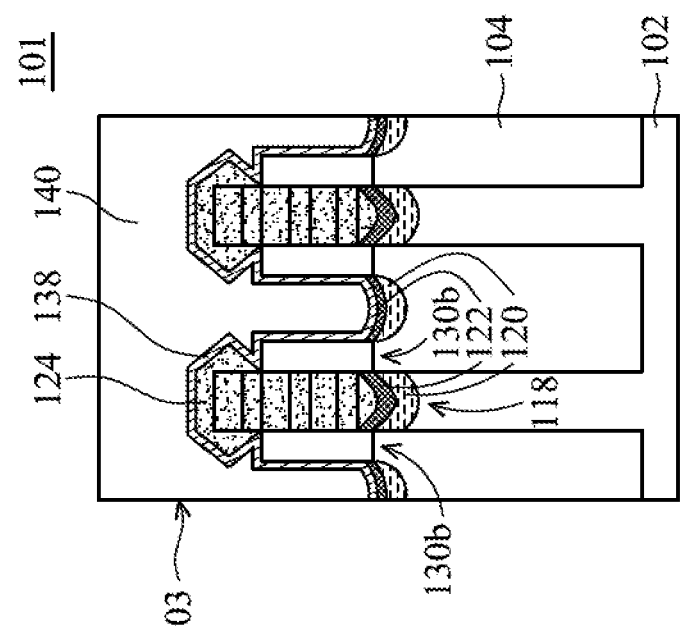
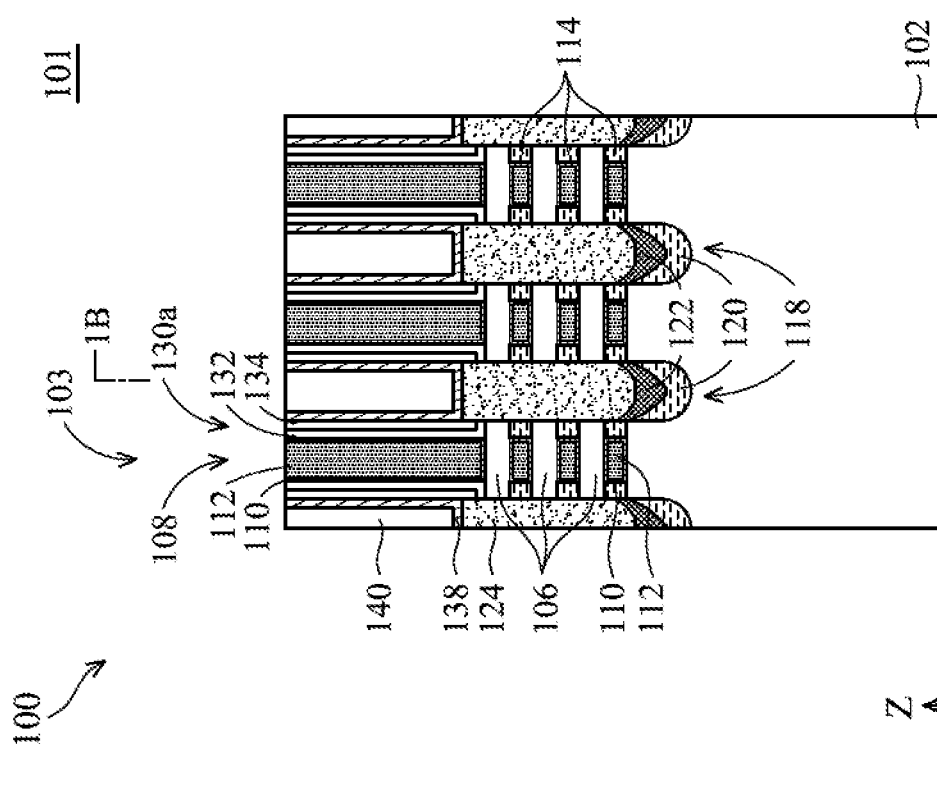
Figure 1B
Figure 1A

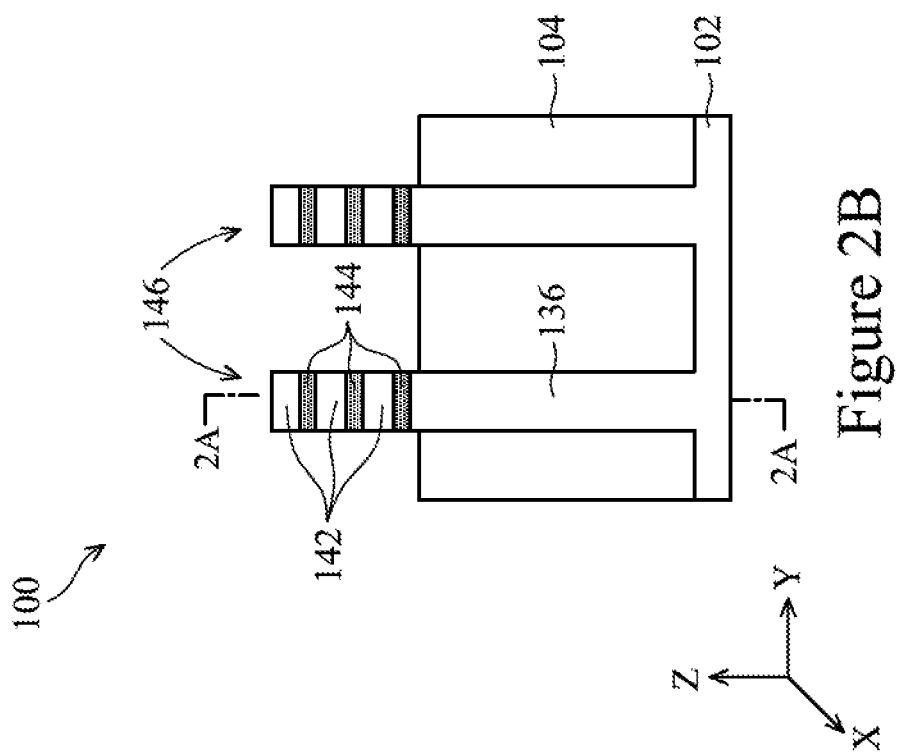
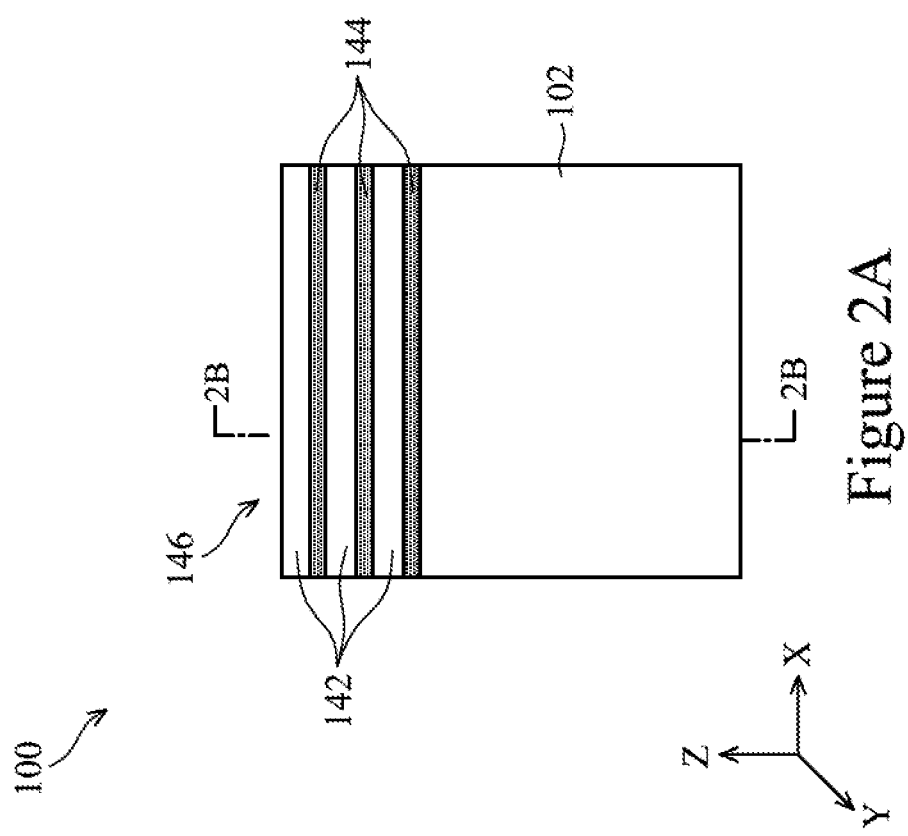

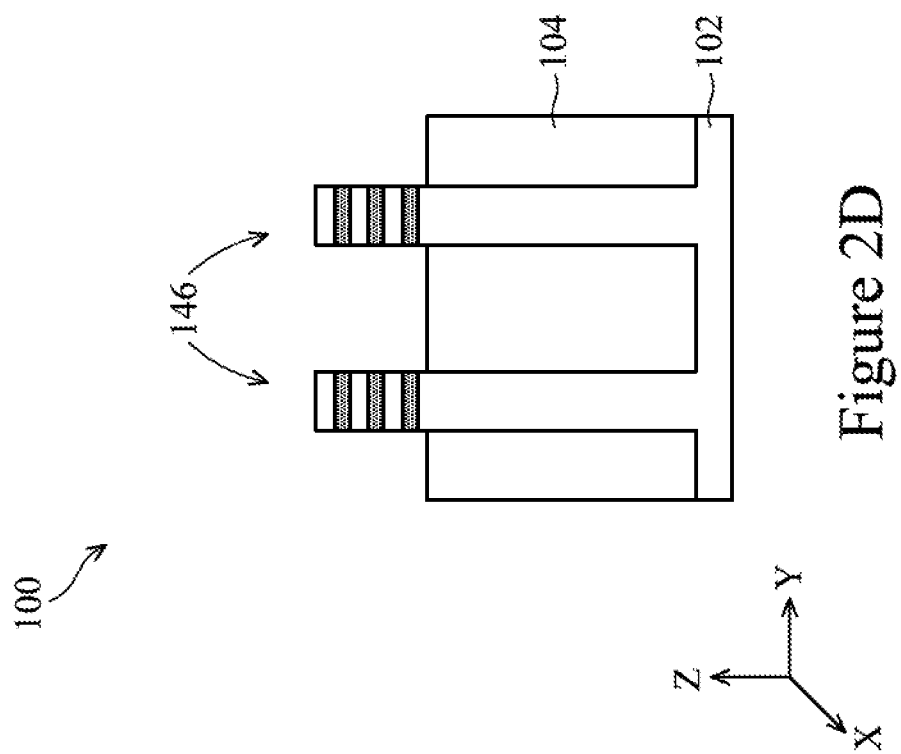
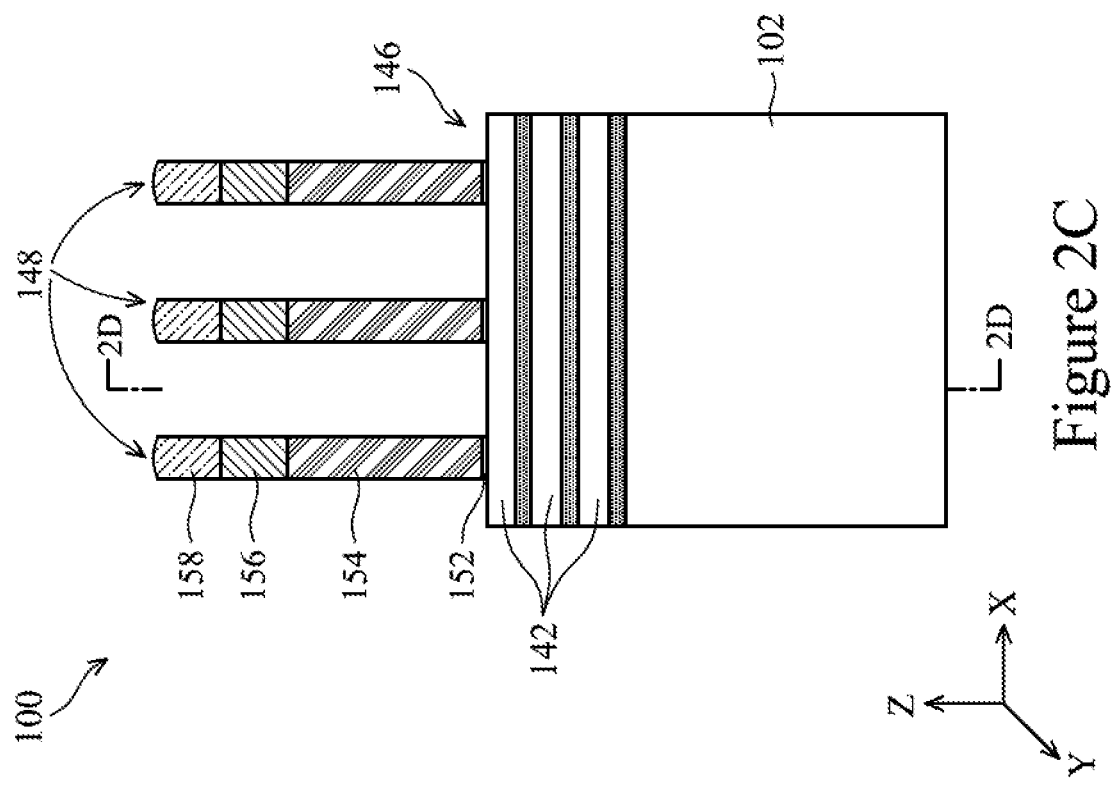

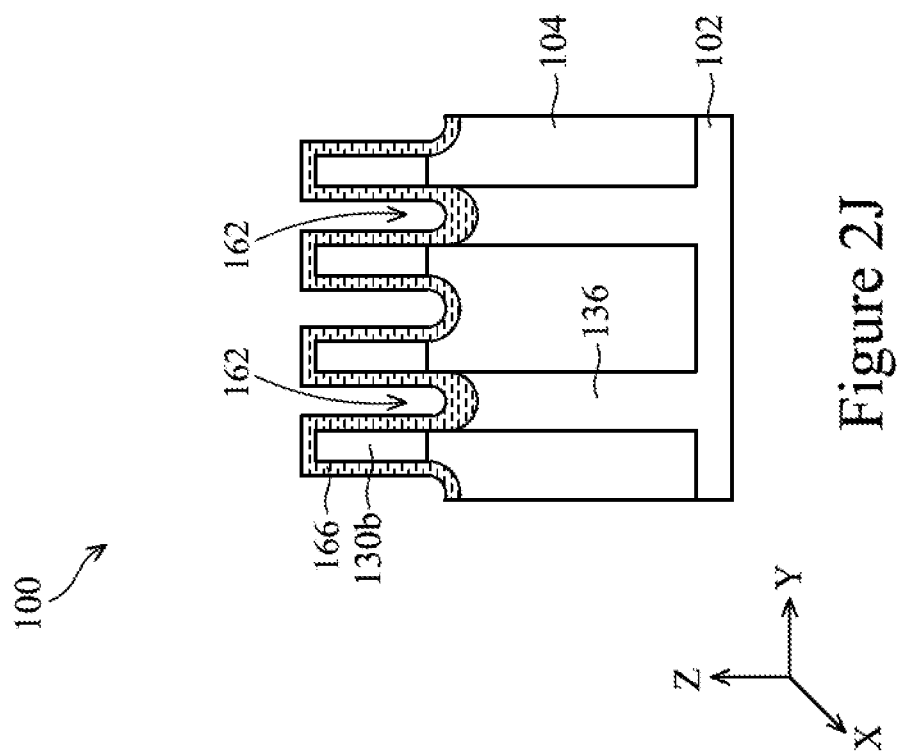
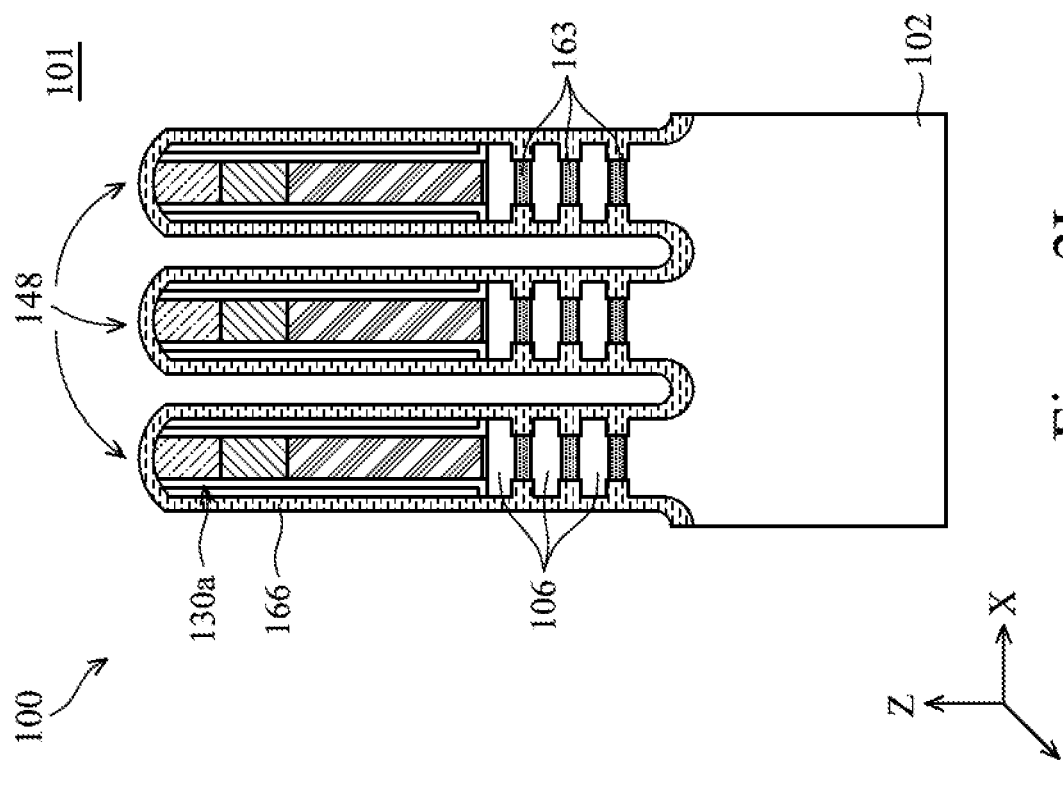
Figure 2I
Figure 2J

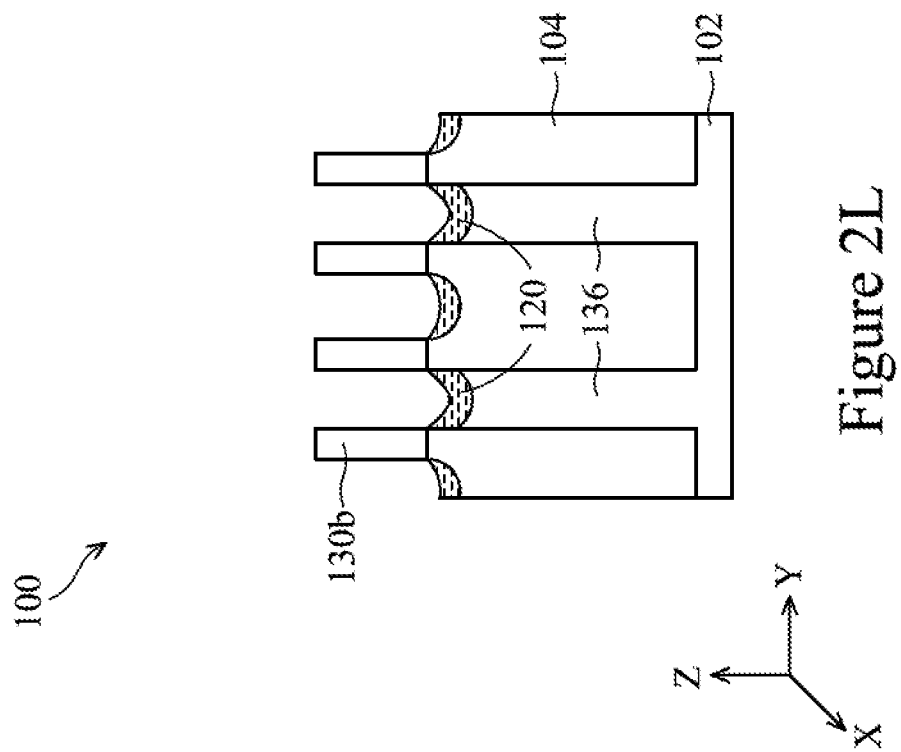
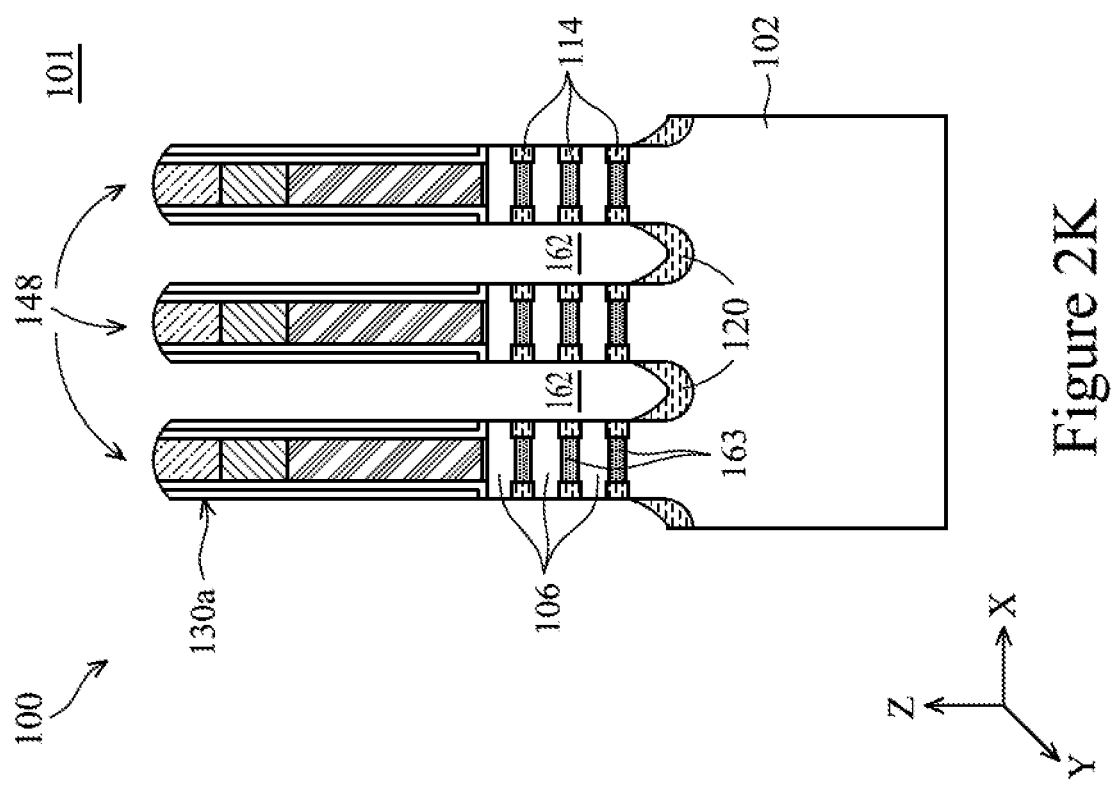
Figure 2K
Figure 2L

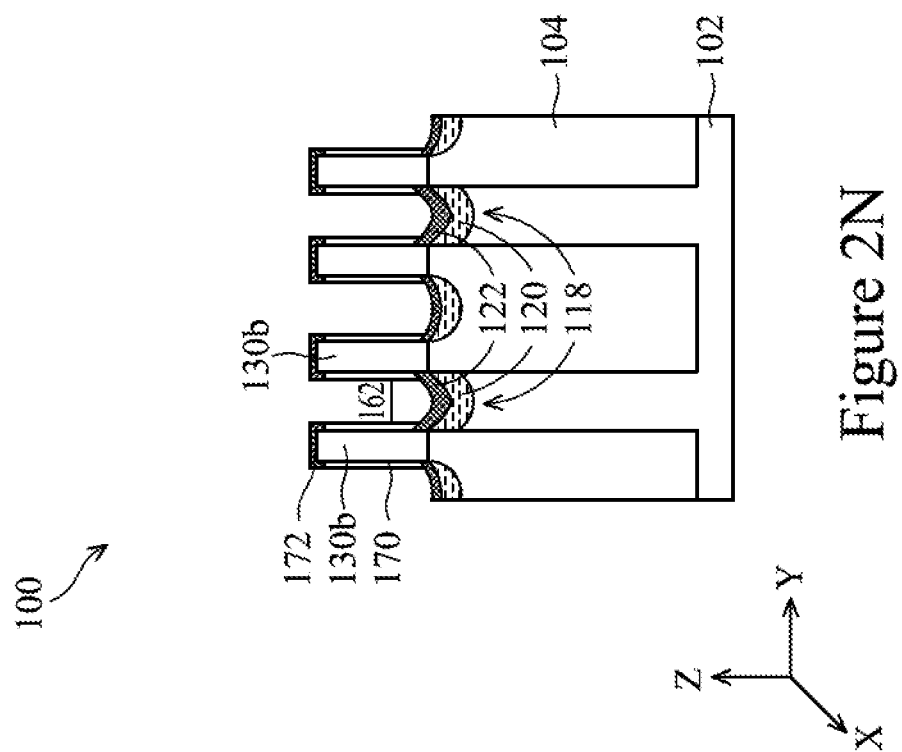
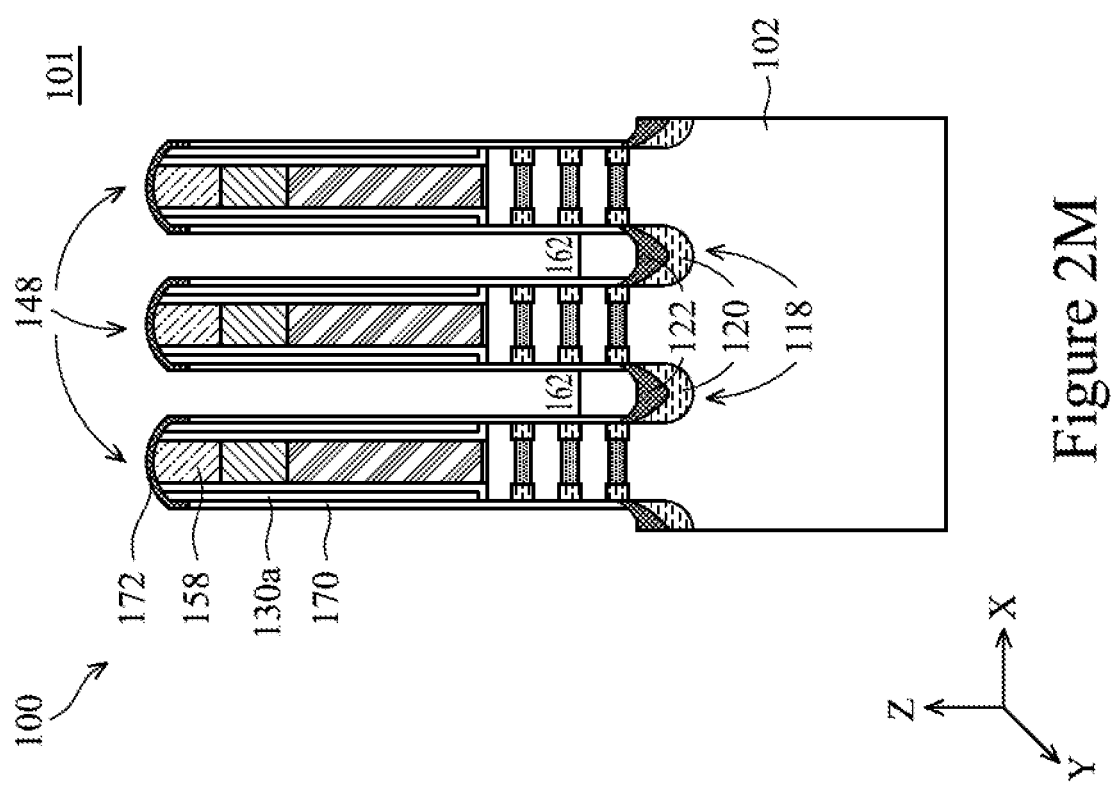
Figure 2M
Figure 2N

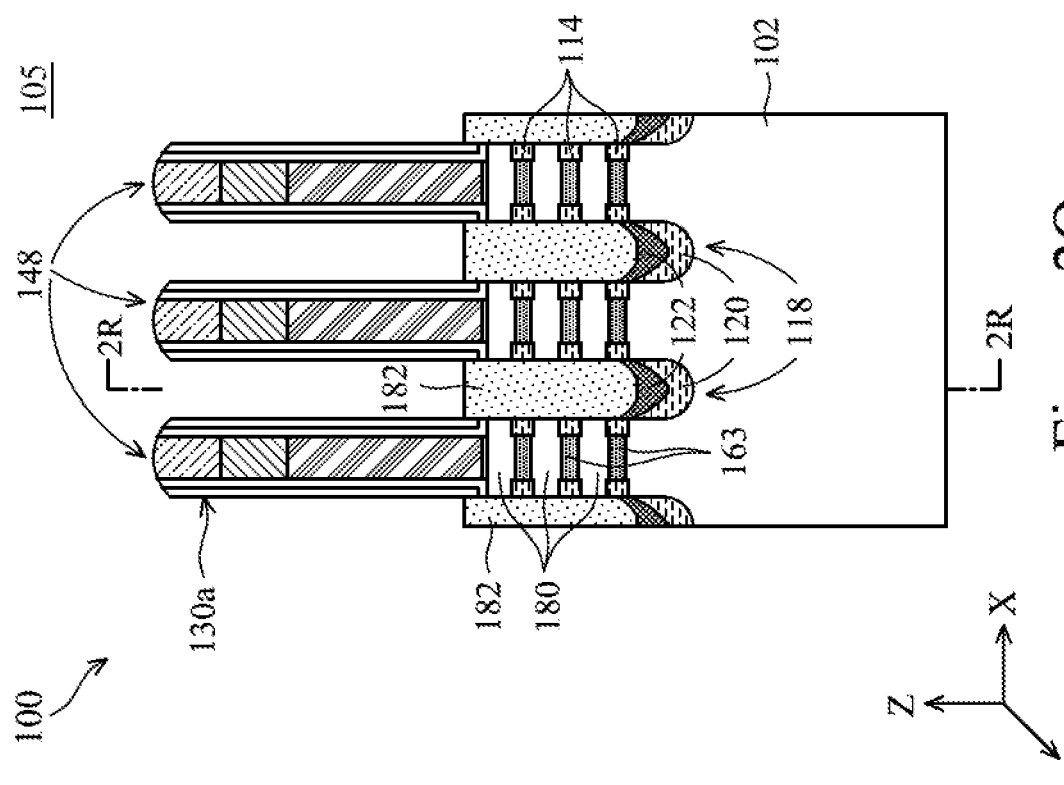
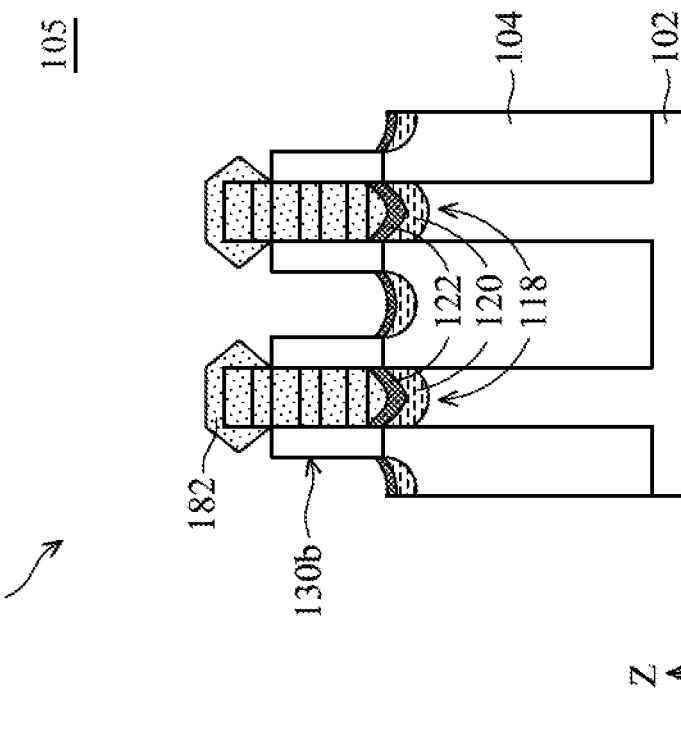
Figure 2Q
Figure 2R

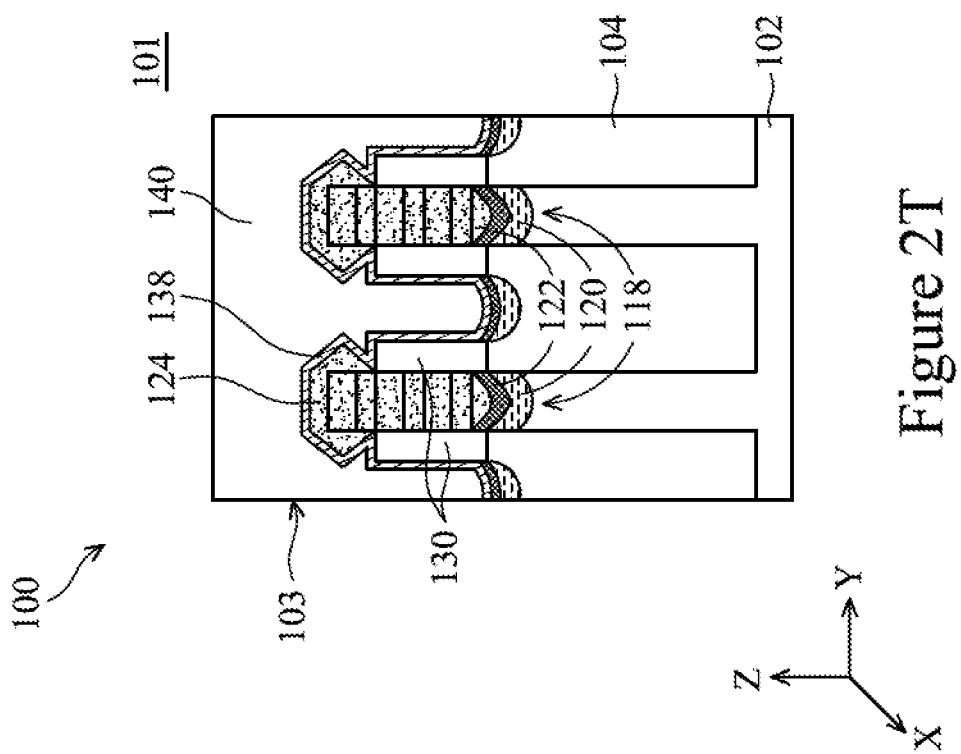
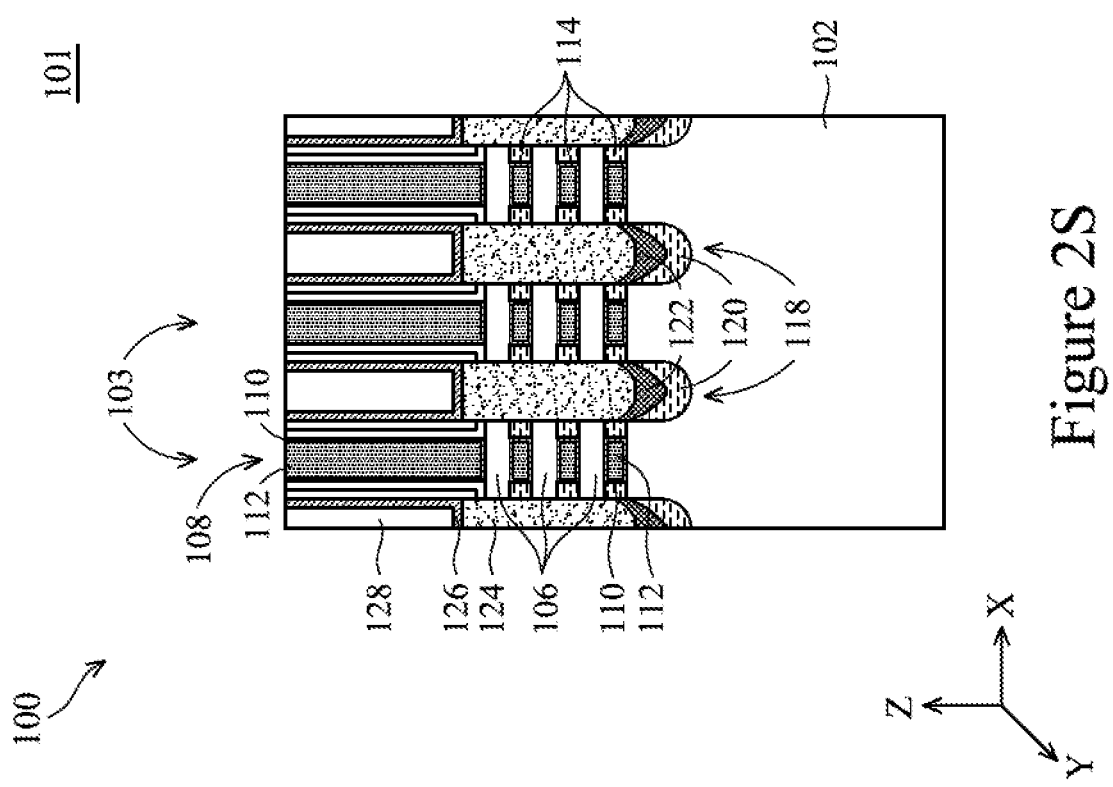

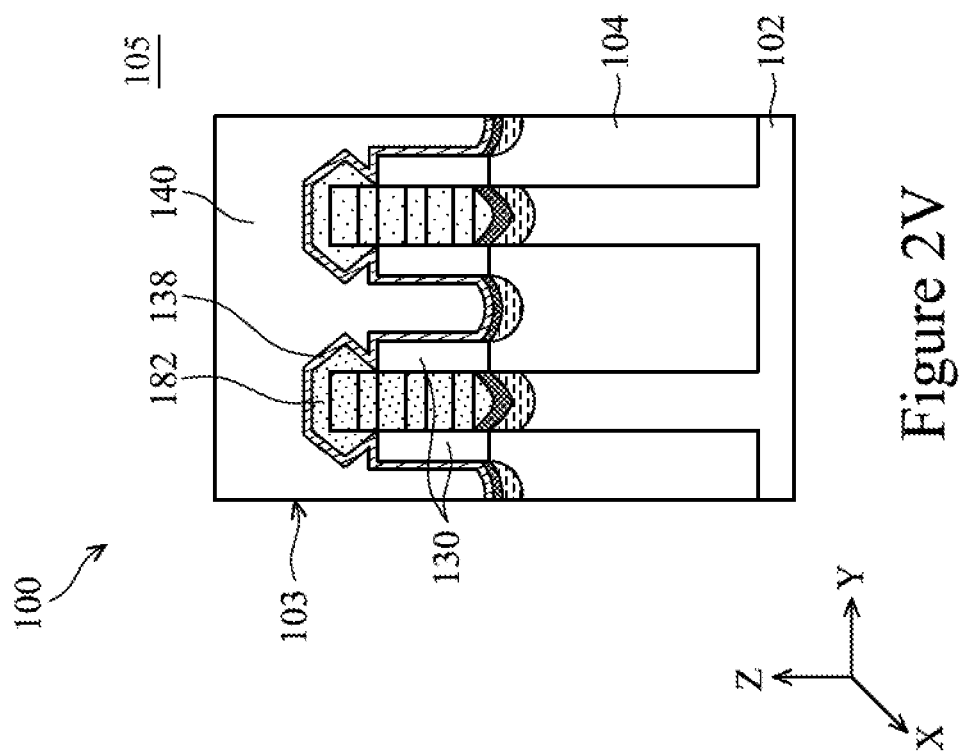
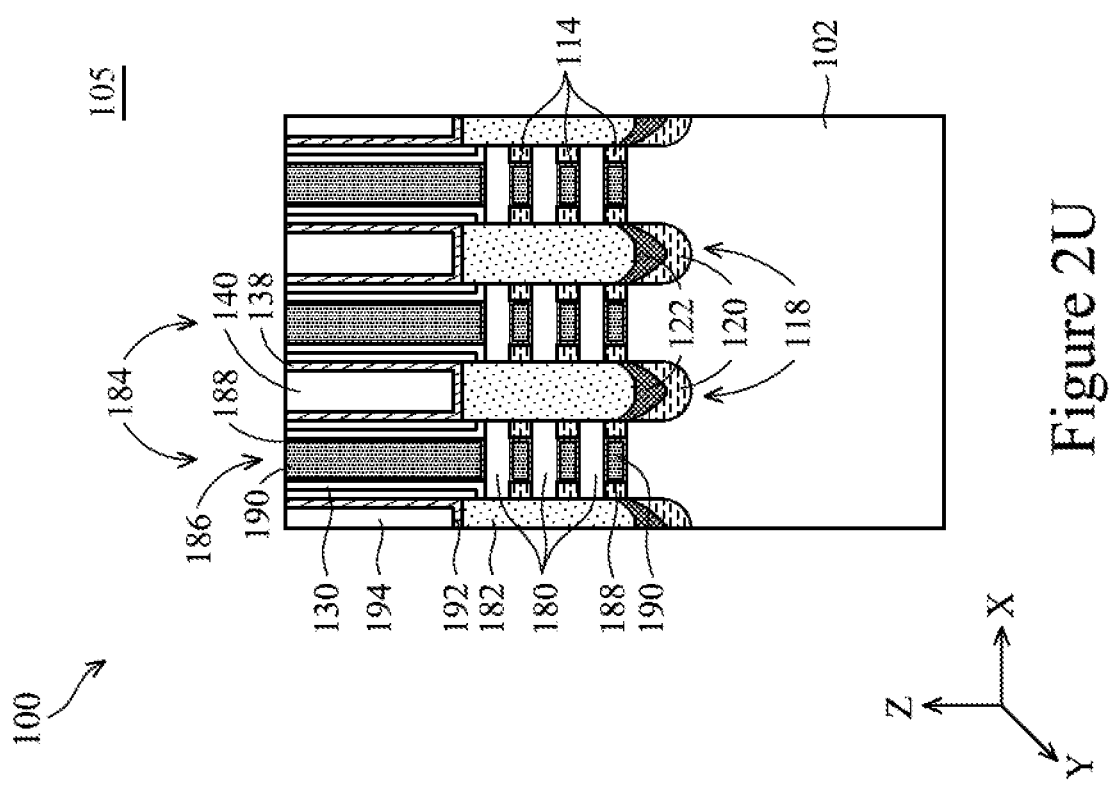
Figure 2U
Figure 2V

INTEGRATED CIRCUIT WITH BOTTOM DIELECTRIC INSULATORS AND FIN SIDEWALL SPACERS FOR REDUCING SOURCE/DRAIN LEAKAGE CURRENTS

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over conventional transistors. A nanostructure transistor may include a plurality of semiconductor nanostructures (e.g., nanowires, nanosheets, etc.) that act as the channel regions for a transistor.

As scaling continues, the distance separating conductive features decreases. This can lead to the risk of undesired leakage currents or even short circuits between nearby features. This can result in poorly functioning circuits, non-functioning circuits, and overall decreased yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are cross-sectional views of an integrated circuit, in accordance with some embodiments.

DETAILED DESCRIPTION

Figure 2F:
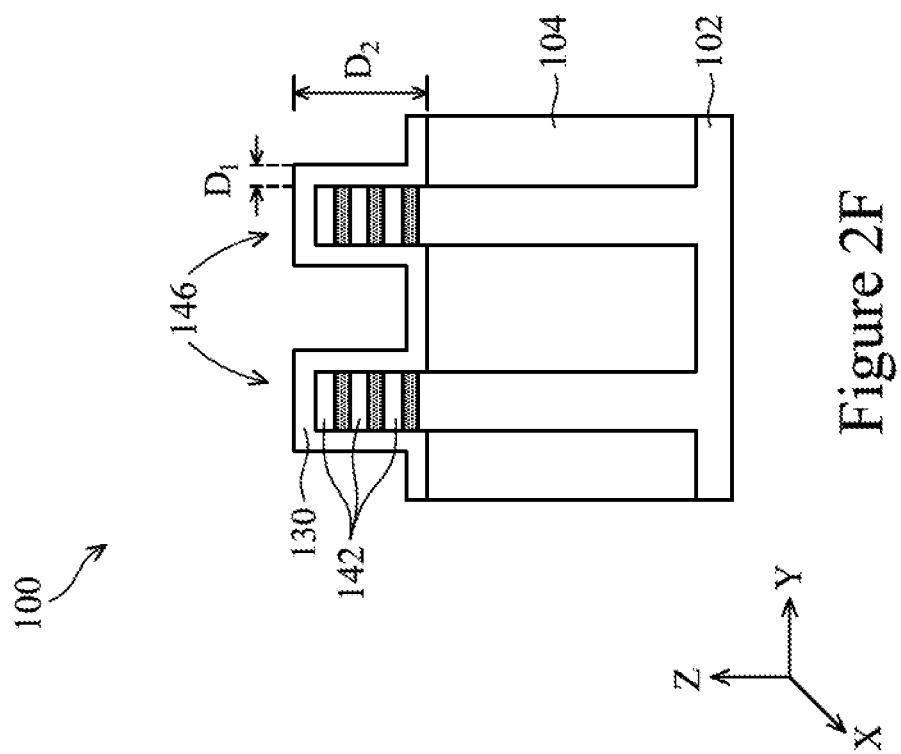
FIGS. 2A-2V are cross-sectional views of an integrated circuit at various stages of processing, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having reduced source/drain leakage currents. The semiconductor nanostructure transistors include bottom dielectric barrier structures for reducing leakage from source/drain regions to the substrate. The semiconductor nanostructure transistors also utilize fin sidewall spacers for limiting lateral growth during source/drain epitaxial growth, thereby reducing the risk that adjacent source/drain regions can contact each other due to lateral overgrowth.

Reducing leakage currents and unwanted bridging between adjacent source/drain regions has several benefits. For example, transistors will consume less power as leakage currents are reduced. Furthermore, the prevention of source/drain bridging will result in better functioning integrated circuits and overall higher wafer yields.

FIG. 1A is a cross-sectional view of an integrated circuit 100, in accordance with some embodiments. The integrated circuit 100 includes a substrate 102. The integrated circuit 100 includes transistors 103. As will be set forth in more detail below, the transistors 103 utilize bottom isolation structures and dummy gate sidewall spacers to reduce source/drain leakage currents and source/drain bridging.

The transistors 103 may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistor 103 may each include a plurality of semiconductor nanostructures corresponding to channel regions of the transistor 103. The semiconductor nanostructures may include nanosheets, nanowires, or other types of nanostructures. The gate all around transistors may also be termed nanostructure transistors.

The view of FIG. 1A is an "X-cut" in which the X-axis is the horizontal axis, the Z-axis is the vertical axis, and the Y-axis is into and out of the drawing sheet. Furthermore, FIG. 1A shows a region 101 at which transistors having a particular conductivity type are formed. In one example, N-type transistors are formed at the region 101, though P-type transistors can be utilized without departing from the scope of the present disclosure. As used herein, the term "X-view" corresponds to a cross-sectional view in which the X-axis is the horizontal dimension and the Z-axis is the vertical dimension. As used herein, the term "Y-view" corresponds to a cross-sectional view in which the Y-axis is the horizontal dimension and the Z-axis is the vertical dimension.

In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In an example process described herein, the substrate 102 includes Si, though other semiconductor materials can be utilized without departing from the scope of the present disclosure.

The transistor 103 include a plurality of semiconductor nanostructures 106. The semiconductor nanostructures 106 are stacked in the vertical direction or Z-direction. In the example of FIG. 1A, there are three stacked semiconductor nanostructures 106. However, in practice, there may be only two stacked nanostructures 106 or there may be more than three stacked nanostructures 106 without departing from the scope of the present disclosure. The semiconductor nanostructures 106 correspond to channel regions of the transistor 103. The semiconductor nanostructures 106 may be nanosheets, nanowires, or other types of nanostructures.

The semiconductor nanostructures 106 may include one or more layers of Si, SiGe, or other semiconductor materials. In a non-limiting example described herein, the semiconductor nanostructures 106 are silicon. The vertical thickness of the semiconductor nanostructures 106 can be between 3 nm and 10 nm. The semiconductor nanostructures 106 may be separated from each other in the vertical direction by 2 nm to 10 nm. Other thicknesses and materials can be utilized for the semiconductor nanostructures 106 without departing from the scope of the present disclosure.

The transistor 103 includes a gate electrode 108. The gate electrode 108 includes an upper portion above the top semiconductor nanostructure 106. The gate electrode 108 also includes a lower portion that surrounds the semiconductor nanostructures 106.

In the example of FIG. 1A, the gate electrode 108 includes a first gate metal 110 and a second gate metal 112. The first gate metal 110 may include titanium nitride, tantalum nitride, tantalum, titanium, or other suitable conductive materials. The second gate metal 112 may correspond to a gate fill material. The second gate metal 112 may include one or more of titanium nitride, tungsten, tantalum, tantalum nitride, tantalum aluminum nitride, ruthenium, cobalt, aluminum, titanium, or other suitable conductive materials. Other materials and configurations can be utilized for the gate electrode 108 without departing from the scope of the present disclosure.

The transistor 103 includes a gate dielectric (not shown). The gate dielectric is positioned between the gate electrode 108 and the semiconductor nanostructures 106. The gate dielectric surrounds the semiconductor nanostructures 106. The gate electrode 108 surrounds the gate dielectric.

In some embodiments, the gate dielectric includes a high-K gate dielectric layer and an interfacial gate dielectric layer. The interfacial gate dielectric layer is a low-K gate dielectric layer. The interfacial gate dielectric layer is in contact with the semiconductor nanostructures 106. The high-K gate dielectric layer is in contact with the low-K gate dielectric layer and the gate electrode 108. The interfacial gate dielectric layer is positioned between the semiconductor nanostructures 106 and the high-K gate dielectric layer. The low-K gate dielectric layer may be termed an interfacial gate dielectric layer.

The interfacial gate dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. The thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes $HfO_2$ with dipole doping including La and Mg, and a second layer including a higher-K ZrO layer with crystallization.

The transistor 103 includes source/drain regions 124. The source/drain regions 124 are in contact with each of the semiconductor nanostructures 106. Each nanostructure 106 extends in the X-direction between the source/drain regions 124. The source/drain regions 124 include a semiconductor material. The source/drain regions 124 can be doped with N-type dopants species in the case of an N-type transistor.

The N-type dopant species can include P, As, or other N-type dopant species. The source/drain regions 124 can be doped with P-type dopant species in the case of a P-type transistor. The P-type dopant species can include B or other P-type dopant species. The doping can be performed in-situ during an epitaxial growth process of the source/drain regions 124. The source/drain regions 124 can include other materials and structures without departing from the scope of the present disclosure.

The transistor 103 includes inner spacers 114. The inner spacers 114 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In one example, the inner spacers 114 include silicon oxycarbonitride. The inner spacers 114 physically separate the gate electrode 108 from the source/drain regions 124. This prevents short circuits between the gate electrode 108 and the source/drain regions 124. The inner spacers 114 may have a horizontal width between 2 nm and 10 nm. The inner spacers 114 may have a vertical height between 2 nm and 10 nm. Other materials, dimensions, and structures can be utilized for the inner spacers 114 without departing from the scope of the present disclosure.

The transistor 103 includes bottom isolation structures 118. The bottom isolation structures 118 are positioned below the source/drain regions 124. In particular, the bottom isolation structures 118 are positioned between the source/drain regions 124 and the substrate 102. The bottom isolation structures 118 may be positioned in contact with a top surface of the semiconductor substrate 102 and the bottom surfaces of the source/drain regions 124.

The presence of the bottom isolation structures 118 ensures that leakage currents will not flow from the source/drain regions 124 into the semiconductor substrate 102. This can greatly enhance the efficiency of the transistor 103 by substantially eliminating leakage currents. This reduces power consumption and heat generation.

In practice, the integrated circuit 100 may have a very large number of transistors of the same type as the transistor 103. Each of these transistors may have the bottom isolation structure 118 to help prevent leakage currents. Accordingly, the bottom isolation structure 118 can be utilized to substantially eliminate leakage current from thousands or millions of source/drain regions 124 in the integrated circuit 100. This results in a very large reduction in power consumption and heat generation for the integrated circuit 100.

In some embodiments, the bottom isolation structure 118 includes a first dielectric barrier layer 120 and a second dielectric barrier layer 122. In some embodiments, the first dielectric barrier layer 120 includes one or more of silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In some embodiments, the first dielectric barrier layer 120 has a vertical thickness between 5 nm and 15 nm. Other materials and thicknesses can be utilized for the first dielectric barrier 120 without departing from the scope of the present disclosure.

In some embodiments, the first dielectric barrier layer 120 is a same material as the inner spacers 114. As will be set forth in further detail below, the inner spacers 114 and the first dielectric barrier layer 120 are deposited in a same conformal thin-film deposition process. A subsequent etching process removes the thin-film except that the position of the inner spacers 114 and the first dielectric barrier layer 120.

In some embodiments, the second dielectric barrier layer 122 includes one or more of silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In some embodiments, the second dielectric barrier layer 122 has a vertical thickness between 5 nm and 15 nm. Other materials and thicknesses can be utilized for the second dielectric barrier layer 122 without departing from the scope of the present disclosure.

The first dielectric barrier layer 120 is in direct contact with the substrate 102. The second dielectric barrier layer 122 is positioned on the first dielectric barrier layer 120. A bottom surface of the source/drain region 124 is in contact with a top surface of the second dielectric barrier layer 122. In one example, the first dielectric barrier layer 120 includes silicon oxycarbonitride and the second dielectric barrier layer 122 includes SiN. In one example, the first dielectric barrier layer 120 includes silicon oxycarbonitride and the second dielectric barrier layer 122 includes silicon oxycarbide.

The transistor 103 includes sidewall spacers 130a and sidewall spacers 130b. The sidewall spacers 130a are positioned on sidewalls of the gate electrode 108. The sidewall spacers 130a electrically isolate the gate electrode 108 from the source/drain contacts. The sidewall spacers 130a may have a horizontal width between 3 nm and 10 nm. The sidewall spacers 130a may include one or more of silicon oxide, silicon nitride, silicon oxynitride, silicon carbonitride, silicon oxycarbonitride, fluorine-doped silicate glass (FSG), a low-K dielectric material or other dielectric materials. Other thicknesses and materials can be utilized for the sidewall spacers 130a without departing from the scope of the present disclosure.

In some embodiments, the sidewall spacers 130a include a pair of dielectric layers 132 and 134. The dielectric layers 132 and 134 may collectively function as gate spacer layers positioned between the gate electrode 108 and the source/drain contact. The dielectric layer 132 may be positioned in contact with the gate electrode 108 and may include SiN, SiON, SiOCN, SiCN, or other suitable dielectric materials. The dielectric layer 134 may include silicon oxide or another suitable dielectric material. The sidewall spacers 130a may include fewer or more dielectric layers than two. As will be set forth in further detail in relation to FIG. 1B, the sidewall spacers 130a can be utilized to assist in ensuring that source/drain regions 124 of transistors 103 that are adjacent to each other in the Y-direction do not bridge together during the epitaxial growth of the source/drain regions 124.

In some embodiments, a thin dielectric layer 138 covering the source/drain regions 124, the sidewall spacers 130a, and exposed portions of the dielectric layer 122 between adjacent source/drain regions 124. The dielectric layer 138 may include one or more of silicon oxide, silicon nitride, silicon oxynitride, silicon carbonitride, silicon oxycarbonitride, fluorine-doped silicate glass (FSG), a low-K dielectric material or other dielectric materials. An interlevel dielectric layer 140 covers the dielectric layer 138. The interlevel dielectric layer 140 can include one or more of silicon oxide, silicon nitride, silicon oxynitride, silicon carbonitride, silicon oxycarbonitride, fluorine-doped silicate glass (FSG), a low-K dielectric material or other dielectric materials.

The transistor 103 may include source/drain contacts (not shown). Each source/drain contact is positioned over and is electrically connected to a respective source/drain region 124. Electrical signals may be applied to the source/drain regions 124 via the source/drain contacts. The source/drain contacts may also include a thin conductive layer in direct contact with the source/drain regions 124. The source/drain contacts may also include a conductive layer positioned on the thin conductive layer. The thin conductive layer can include titanium nitride, tantalum nitride, titanium, tantalum, or other suitable conductive materials. The conductive layer can include a conductive material such as tungsten, cobalt, ruthenium, titanium, aluminum, tantalum, or other suitable conductive materials. Other materials and configurations can be utilized for the source/drain contacts without departing from the scope of the present disclosure.

The source/drain contacts may include silicide. The silicide is formed at the top of the source/drain regions 124. The thin conductive layer may be positioned in contact with the silicide. The silicide promotes good electrical connection between the source/drain contacts and the source/drain regions 124. The silicide can include titanium silicide, aluminum silicide, nickel silicide, tungsten silicide, or other suitable silicides.

The transistor 103 can be operated by applying voltages to the source/drain regions 124 and the gate electrode 108. The voltages can be applied to the source/drain regions 124 via the source/drain contacts. The voltages can be applied to the gate electrode 108 via a gate contact not shown in FIG. 1A. The voltages can be selected to turn on the transistor 103 or to turn off the transistor 103. When the transistor 103 is turned on, currents may flow between the source/drain regions 124 through each of the semiconductor nanostructures 106. When the substrate 102 is turned off, currents do not flow through the semiconductor nanostructures 106.

FIG. 1B is a cross-sectional view of the integrated circuit 100 of FIG. 1A taken along cut lines 1B of FIG. 1A. Accordingly, in the view of FIG. 1B, the Y-axis is the horizontal axis, while the X-axis is into and out of the drawing sheet. FIG. 1B illustrates how the sidewall spacers 130b are influential in the shape of the source/drain regions 124. The sidewall spacers 130a and 130b are formed from a same blanket deposition process and are in fact a same sidewall spacer layer, though patterning has resulted in the sidewall spacers 130a and 130b being physically isolated from each other. The sidewall spacers 130a may be termed upper sidewall spacers, upper portions of a sidewall spacer, or gate sidewall spacers. The sidewall spacers 130b may be termed lower sidewall spacers, lower portions of a sidewall spacer, or fin sidewall spacers.

FIG. 1B illustrates shallow trench isolation regions 104. The shallow trench isolation regions 104 correspond to a dielectric material that fills spaces in between upward extending portions 136 of the substrate 102. The shallow trench isolation regions 104 can help to electrically isolate the body regions of adjacent transistors 103. The shallow trench isolation regions 104 can include silicon oxide, silicon nitride, silicon oxynitride, or other suitable dielectric materials. The sidewall spacers 130b are on a top surface of the shallow trench isolation regions 104. As will be described in further detail in relation to FIGS. 2A-2V, the process for forming the sidewall spacers 130 results in portions of the sidewall spacers 130b remaining on top of the shallow trench isolation regions 104.

In some embodiments, the sidewall spacers 130b on the shallow trench isolation region 104 have a height between 5 nm and 30 nm from the shallow trench isolation regions 104. The height of the portions of the sidewall spacers 130b help ensure that when the source/drain regions 124 are grown in an epitaxial growth process, the lateral growth in the Y-direction is inhibited. Only a small portion of the source/drain regions 124 above the sidewall spacers 130b are allowed to grow laterally, and only to a small extent. Because lateral growth of the larger portion of the source/drain regions 124 are inhibited by the sidewall spacers 130b, the source/drain regions 124 cannot grow laterally to a sufficient extent that they bridge together. Accordingly, utilizing relatively high sidewall spacers to bounded lateral growth of source/drain regions 124 effectively inhibits undesired short circuiting between source/drain regions of adjacent transistors. A further benefit of this is that further scaling can be utilized to decrease the distance between adjacent source/drain regions 124 without the risk of unwanted bridging during the epitaxial growth processes. Other dimensions, configurations, and processes can be utilized for sidewall spacers 130b without departing from the scope of the present disclosure.

FIG. 1B also illustrates the thin dielectric layer 138 covering the source/drain regions 124, the sidewall spacers 130b, and the exposed portions of the dielectric layer 122 between adjacent source/drain regions 124.

FIGS. 2A-2V are cross-sectional views of an integrated circuit 100 at various stages of processing, in accordance with some embodiments. FIGS. 2A-2V illustrate a process for forming the transistors 103 shown in FIGS. 1A and 1B, in accordance with some embodiments. In one example, the transistors 103 are N-type transistors. As will be described in further detail below, P-type transistors can also be formed simultaneously during the process for forming the N-type transistors 103.

FIG. 2A is a cross-sectional X-view of an integrated circuit 100, in accordance with some embodiments. In FIG. 2A, a semiconductor fin 146 includes a plurality of semiconductor layers 142 and a plurality of sacrificial semiconductor layers 144 stacked on the substrate 102. The sacrificial semiconductor layers 144 are positioned between the semiconductor layers 142. As will be described in more detail below, the semiconductor layers 142 will eventually be patterned to form the semiconductor nanostructures 106 that corresponds to the channel regions of the transistors 103. Accordingly, the semiconductor layers 142 can have materials and dimensions described in relation to the semiconductor nanostructures 106 of FIGS. 1A and 1B.

The sacrificial semiconductor layers 144 includes a semiconductor material different than the semiconductor material of the semiconductor layers 142. In particular, the sacrificial semiconductor layers 144 include materials that are selectively etchable with respect to the material of the semiconductor layers 142. As will be described in further detail below, the sacrificial semiconductor layers 144 will eventually be patterned to form sacrificial semiconductor nanostructures. The sacrificial semiconductor nanostructures will eventually be replaced by gate metals of the gate electrodes 108 positioned between the semiconductor nanostructures 106. In one example, the sacrificial semiconductor layers 144 can include a single crystalline semiconductor material such as, but not limited to Si, Ge, SiGe, GaAs, InSb, GaP, GaSb, InAlAs, InGaAs, GaSbP, GaAsSb and InP. In an example process described herein, the sacrificial semiconductor layers 144 include SiGe, while the semiconductor layers 142 include Si. Other materials and configurations can be utilized for the sacrificial semiconductor layers 144 and the semiconductor layers 142 without departing from the scope of the present disclosure.

FIG. 2B illustrates a Y-view of the integrated circuit 100 taken along cut lines 2B of FIG. 2A. FIG. 2B illustrates that there are a plurality of semiconductor fins 146 extending in the X-direction and spaced apart from each other in the Y-direction. FIG. 2B also illustrates the shallow trench isolation regions 104 between upper portions 136 of the substrate 102. The upper portions 136 of the substrate 102 are each part of a respective semiconductor fin 146. The shallow trench isolation regions 104 can include materials as described in relation to FIG. 1B.

FIG. 2C is an X-view of the integrated circuit 100, in accordance with some embodiments. In FIG. 2C, a plurality of dummy gate structures 148 have been formed and patterned on the semiconductor fins 146. The dummy gate structures 148 correspond to fins that extend in the Y-direction and that are spaced apart from each other in the X-direction. Though not apparent in the views of FIGS. 2C and 2D, as the dummy gate structures 148 extend in the Y-direction, the dummy gate structures 148 are also formed on the shallow trench isolation regions 104 between the semiconductor fins 146. The dummy gate structures 148 are referred to as dummy gate structures because the gate electrodes 108 will be formed, partly, in place of the dummy gate structures 148, as will be described in further detail below. However, the dummy gate structures 148 may also be termed fins.

The dummy gate structures 148 each include a dielectric layer 152. The dielectric layer 152 can include a thin layer of silicon oxide grown on the top semiconductor layer 142 via chemical vapor deposition (CVD), physical vapor deposition (PVD), or atomic layer deposition (ALD). The dielectric layer 152 may have a thickness between 0.2 nm and 2 nm. Other thicknesses materials, and deposition processes can be utilized for the dielectric layer 152 without departing from the scope of the present disclosure.

The dummy gate structures 148 each include a layer of polysilicon 154. The layer of polysilicon 154 can have a thickness between 20 nm and 100 nm. The layer of polysilicon 154 can be deposited by an epitaxial growth, a CVD process, a physical vapor deposition (PVD) process, or an ALD process. Other thicknesses and deposition processes can be used for depositing the layer polysilicon 154 without departing from the scope of the present disclosure.

The dummy gate structures 148 each include a dielectric layer 156 on the layer of polysilicon 154 and a dielectric layer 158 on the dielectric layer 156. In one example, the dielectric layer 156 includes silicon nitride. In one example, the dielectric layer 158 includes silicon oxide. The dielectric layers 156 and 158 can be deposited by CVD. The dielectric layer 156 can have a thickness between 5 nm and 15 nm. The dielectric layer 158 can have a thickness between 15 nm and 50 nm. Other thicknesses, materials, and deposition processes can be utilized for the dielectric layers 156 and 158 without departing from the scope of the present disclosure.

FIG. 2D is a Y-view of the integrated circuit 100 at the same stage of processing as FIG. 2C. However, the dummy gate structures 148 are not apparent in the view of FIG. 2D because the cut lines 2D are placed between the dummy gate structures 148. Accordingly, the view of FIG. 2D may appear identical to the view of FIG. 2B.

Figure 2E:
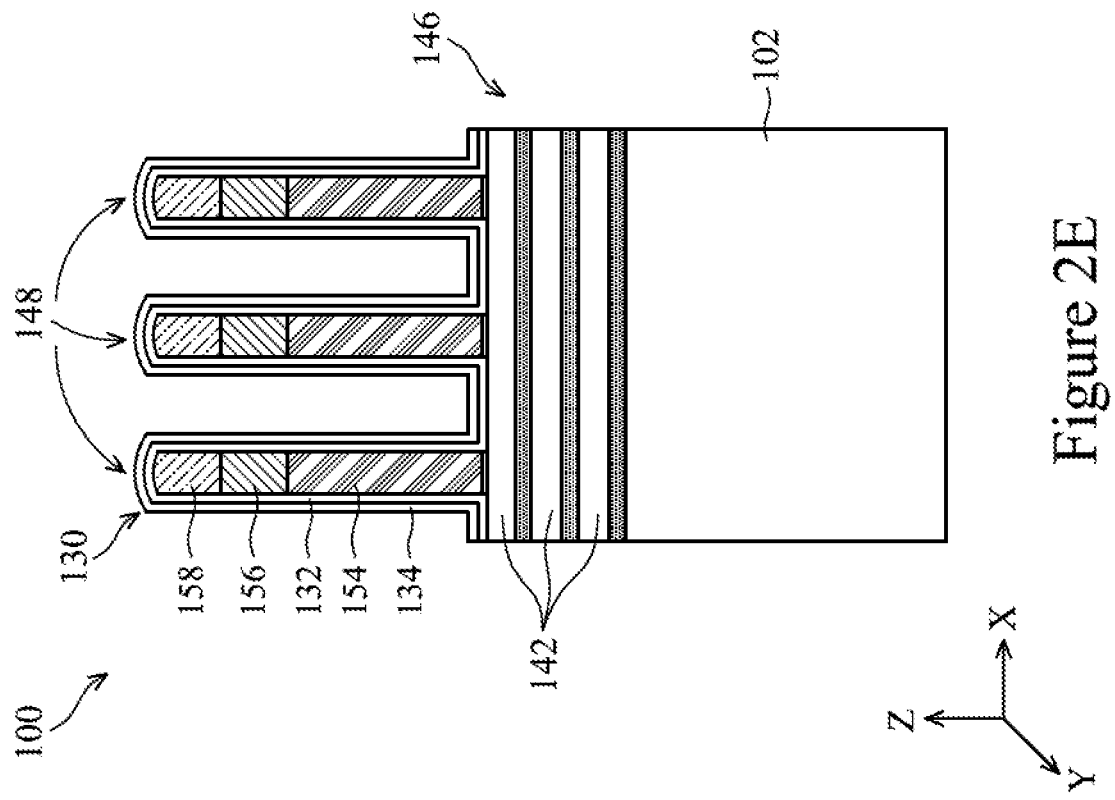

FIG. 2E is an X-view of the integrated circuit 100, in accordance with some embodiments. In FIG. 2E, a sidewall spacer 130 has been formed. The sidewall spacer 130 initially covers the top surfaces and side surfaces of the dummy gate structures 148. The sidewall spacer 130 also initially covers the exposed portions of the top surface of the top semiconductor layer 142 and on the side surfaces semiconductor fins 146. FIG. 2F is a Y-view of the integrated circuit 100 of FIG. 2E. The Y-view of FIG. 2F illustrates that the sidewall spacer 130 initially covers the exposed sidewalls of the semiconductor fins 146 and the exposed top surfaces of the shallow trench isolation regions 104. As will be set forth in more detail below, sidewall spacers 130a and 130b will be patterned from the sidewall spacer 130.

In some embodiments, the sidewall spacer 130 may include a first dielectric layer 132 and a second dielectric layer 134. The dielectric layer 132 can include silicon oxide, silicon nitride, silicon oxynitride, silicon carbonitride, silicon oxycarbonitride, fluorine-doped silicate glass (FSG), a low-K dielectric material or other dielectric materials. The dielectric layer 132 can be deposited by CVD, PVD, ALD, or other suitable processes. The dielectric layer 132 can have a thickness between 1 nm and 5 nm. The dielectric layer 132 can have other materials, deposition processes, and thicknesses without departing from the scope of the present disclosure.

The dielectric layer 134 can include silicon oxide, silicon nitride, silicon oxynitride, silicon carbonitride, silicon oxycarbonitride, fluorine-doped silicate glass (FSG), a low-K dielectric material or other dielectric materials. The dielectric layer 134 can be deposited by CVD, PVD, ALD, or other suitable processes. The dielectric layer 134 can have a thickness between 1 nm and 5 nm. The dielectric layer 134 may have the same material or a different material from the spacer layer 132. Furthermore, the spacer layer 132 and the dielectric layer 134 may jointly be considered a spacer layer for the dummy gate structures 148. The dielectric layer 134 can have other materials, deposition processes, and thicknesses without departing from the scope of the present disclosure.

FIG. 2F illustrates the sidewall spacer 130 as a single layer having a total lateral dimension D1 and a vertical dimension D2 on the exposed portions of the semiconductor fins 146 between dummy gate structures 148. The dimension D1 can be between 2 nm and 10 nm. The dimension D2 may be between 10 nm and 40 nm. Other dimensions and configurations can be utilized for the sidewall spacer 130 without departing from the scope of the present disclosure.

Figure 2H:
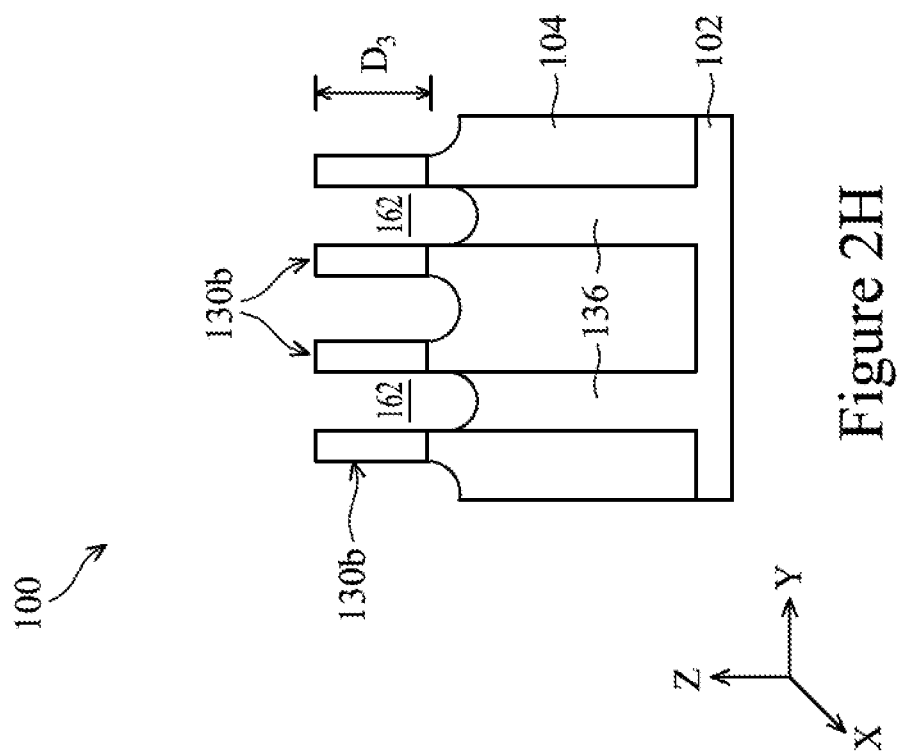
Figure 2G:
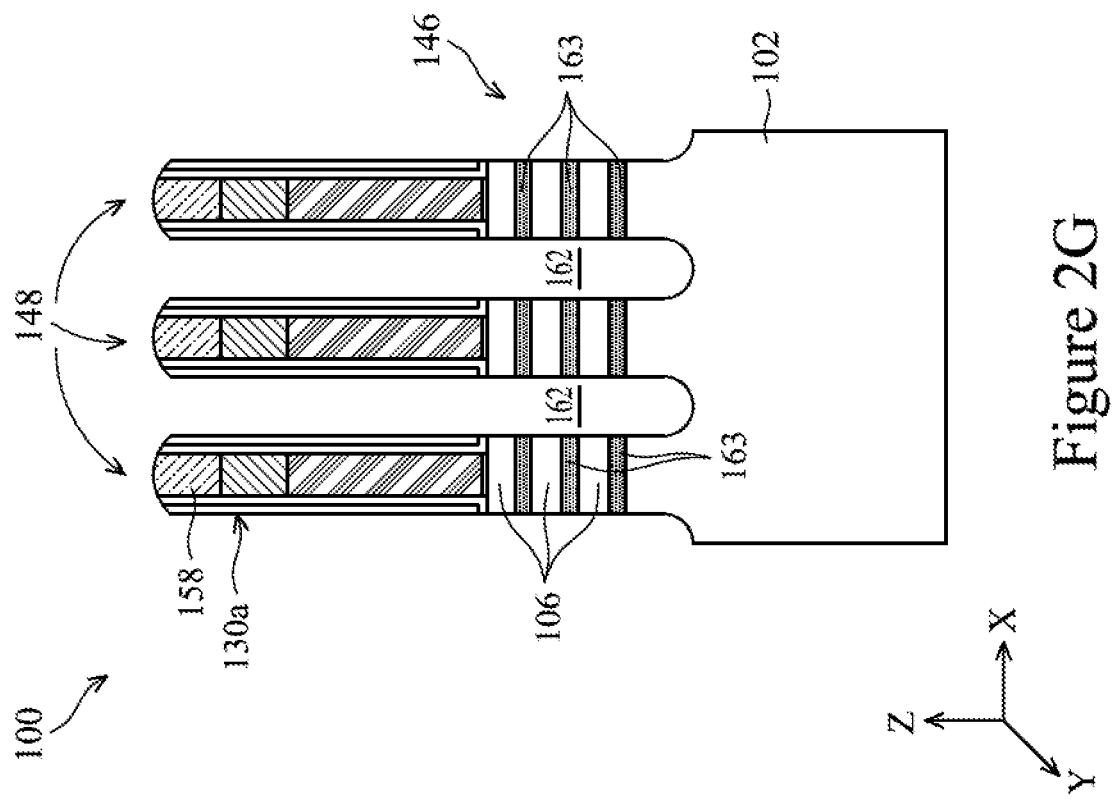

FIG. 2G is an X-view of the integrated circuit 100, in accordance with some embodiments. In FIG. 2G, source/drain trenches 162 have been formed through the semiconductor fins 146. The source/drain trenches 162 corresponds to locations at which source/drain regions 124 will be formed. The etching process to form the source/drain trenches 162 etches the semiconductor layers 142 and the sacrificial semiconductor layers 144 to fully define semiconductor nanostructures 106. More particularly, the etching process defines stacks of semiconductor nanostructures 106. Each stack of semiconductor nanostructures 106 corresponds to the channel regions of a transistor 103. The etching process also defines sacrificial semiconductor nanostructures 163 from the sacrificial semiconductor layers 144. The sacrificial semiconductor nanostructures 163 are positioned between the semiconductor nanostructures 106. The source/drain trenches 162 extend into the semiconductor substrate 102.

The etching process can include one or more anisotropic etching processes that selectively etch the materials of the semiconductor layers 142 and sacrificial semiconductor layers 144 in the vertical direction. The etching process may include a single step or multiple steps. The etching process may include one or more timed etches. Other types of etching processes can be utilized without departing from the scope of the present disclosure.

The etching process also etches the material of the sidewall spacer 130 from the tops of the dielectric layers 158 of the dummy gate structures 148. The result is that sidewall spacers 130a remain on the sidewalls of the dummy gate structures 148.

The Y-view of FIG. 2H illustrates that the sidewall spacers 130b remain on the top surfaces of the shallow trench isolation regions 104. The sidewall spacers 130b that remain on the shallow trench isolation regions 134 have a vertical dimension D3 that may be somewhat reduced from the dimension D2 due to the etch process. The vertical dimension D3 can be between 5 nm and 30 nm. A height of the sidewall spacers 130b in these ranges can help ensure that the source/drain regions 124 will not grow laterally to the extent that bridging may occur between adjacent source/drain regions 124.

FIG. 2H illustrates that formation of the source/drain trenches 162 entirely removes semiconductor layers 142 and the sacrificial semiconductor layers 144 between the sidewall spacers 130b. Formations of the source/drain trenches 162 also reduces the height of the portions 136 of the substrate 102 to a level below the top surface of the shallow trench isolation regions 104. The source/drain trenches 162 between the sidewall spacers 130b correspond to locations at which the source/drain regions 124 will be grown. FIG. 2H also illustrates that the etch process of FIG. 2G also etches portions of the shallow trench isolation region 104 between sidewall spacers 130b. In some embodiments, the etching process can include a first process that etches the dielectric layer 130 in the downward direction, followed be a second etching process that forms the source/drain trenches 162. Either process may result in etching of the shallow trench isolation 104.

In FIG. 2I, a recess step has been performed to recess the sacrificial semiconductor nanostructures 163. The recessing process removes outer portions of the sacrificial semiconductor nanostructures 163 without entirely removing the sacrificial semiconductor nanostructures 163. The recessing process can be performed with an anisotropic etch that selectively etches the material of the sacrificial semiconductor nanostructures 163 with respect to the materials of the semiconductor nanostructures 106 and the substrate 102. The anisotropic etching process can include a timed etching process. The duration of the etching process is selected to remove only a portion of the sacrificial semiconductor nanostructures 163 without entirely removing the sacrificial semiconductor nanostructures 163.

In FIG. 2I, a dielectric layer 166 has been formed on the sidewall spacers 130a, on the top surfaces of the dummy gate structures 148, on the exposed sidewalls of the semiconductor nanostructures 106, at the bottom of the source/drain trench 162, and in the recesses formed in the sacrificial semiconductor nanostructures 163. As will be set forth in more detail below, the dielectric layer 166 will be utilized to form inner spacers 114 and a portion of a bottom spacer 118.

The dielectric layer 166 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer 166 can be formed by CVD, PVD, ALD, or via another process. The lateral thickness of the dielectric layer 166 may be between 2 nm and 10 nm. Other thicknesses, materials, and deposition processes can be utilized for the dielectric layer 166 without departing from the scope of the present disclosure.

FIG. 2J is a Y-view of the integrated circuit 100 of FIG. 2I, in accordance with some embodiments. FIG. 2J illustrates that the dielectric layer 166 is formed on the top and sidewalls of the sidewall spacers 130b and the bottom of the source/drain trenches 162 of the top surfaces of the upward extending portions 136 of the substrate 102. The dielectric layer 166 is also formed on exposed surfaces of the shallow trench isolation regions 104.

FIG. 2K is an X-view of the integrated circuit 100, in accordance with some embodiments. An etching process has been performed to remove portions of the dielectric layer 166. The etching process defines inner spacers 114 and the dielectric barrier structures 120. The etching process can include an isotropic etching process that etches in all directions. The isotropic etching process is timed so that the dielectric layer 166 is removed at all locations except the locations of increased lateral thickness resulting from the recesses in the sacrificial semiconductor nanostructures 163 and at locations of increased vertical thickness of the bottom of the source/drain trenches 162. The result is that the dielectric barrier structures 120 remain at the bottom of the source/drain trenches 162 and that the inner spacers 114 remain at the recesses in the sacrificial semiconductor nanostructures 163. Other processes can be utilized to form the dielectric barrier structures 120 and the inner spacers 114 without departing from the scope of the present disclosure.

The Y-view of FIG. 2L illustrates that the dielectric layer 166 has been removed from the top and side surfaces of the sidewall spacers 130b over the shallow trench isolation regions 104. The dielectric barrier structures 120 remain on the top surfaces of the upward extending portions 136 of the substrate 102.

FIG. 2M is an X-view of the integrated circuit 100, in accordance with some embodiments. In FIG. 2M, a dielectric layer 170 has been conformally deposited on all exposed surfaces of the sidewall spacers 130, the dummy gate structures 148, the inner spacers 114, the semiconductor nanostructures 106, and the dielectric barrier structures 120. The dielectric layer 170 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer 170 can be deposited using CVD, ALD, or PVD and may have a thickness between 2 nm and 5 nm. The deposition process results in an increase in thickness of the bottoms of the source/drain trenches 162.

In some embodiments, the material of the dielectric layer 170 is selectively etchable with respect to the inner spacers 114. In one example, the dielectric layer 170 includes silicon nitride and the inner spacers 114 include silicon oxycarbonitride.

In FIG. 2M, a dopant implantation process is performed. In particular, dopant atoms or ions bombard the integrated circuit 100. The dopant atoms travel substantially straight downward so that the dopant atoms can reach the portions of the dielectric layer 170 at the bottom of the source/drain trenches 162. The dopant atoms also impact the dielectric layer 170 on the tops of the dummy gate structures 148. The result is that the dopant atoms are embedded into the dielectric layer 170 at the bottoms of the source/drain trenches 162 and the tops of the dummy gate structures 148, but not on the portions of the dielectric layer 170 on the sidewalls of the source/drain trenches 162. The implantation of dopant atoms into these portions of the dielectric layer 170 result in compositional changes in the dielectric layer 170 at these locations. In particularly, a dielectric structure 172 is formed at the top of the dummy gate structures 148 and a dielectric barrier structure 122 is formed at the bottoms of the source/drain trenches 162. The dielectric structures 172 and the dielectric barrier structures 122 are selectively etchable with respect to the unchanged portions of the dielectric layer 170 that remain on the sidewalls of the sidewall spacers 130 and the sidewalls of the source/drain trenches 162. Other processes can be utilized for forming the dielectric structures 172 and the dielectric barrier structures 122 without departing from the scope of the present disclosure.

The dielectric barrier structure 120 and the dielectric barrier structure 122 collectively correspond to a bottom isolation structure 118. As will be set forth in more detail below, the bottom isolation structure 118 helps to prevent leakage currents coming to and from the substrate 102.

The Y-view of FIG. 2N illustrates the unchanged regions of the dielectric layer 170 on the sidewalls of the sidewall spacers 130b. FIG. 2N also illustrates the dielectric barrier structure 122 formed on top of the dielectric barrier structure 120.

Figure 2P:
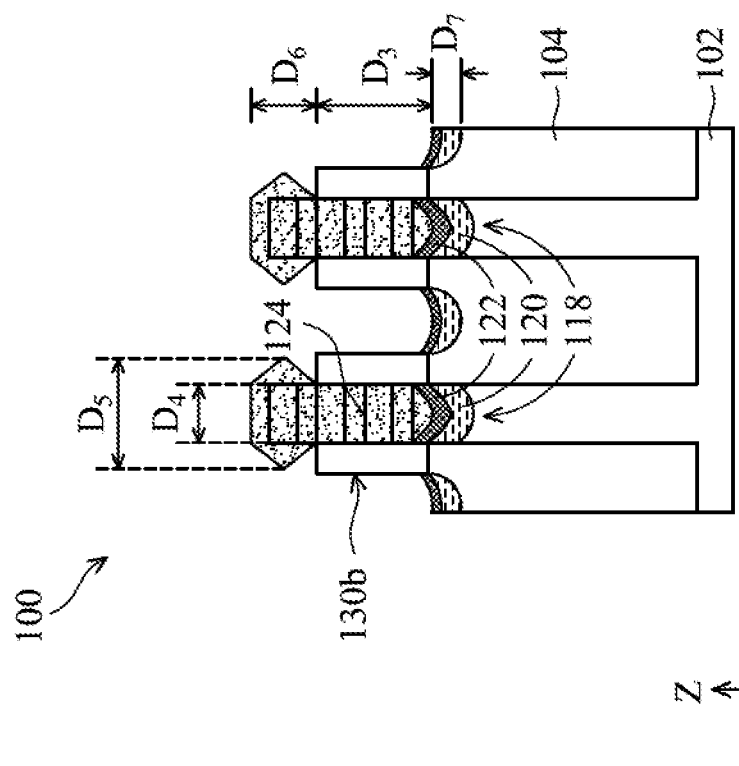
Figure 2O:
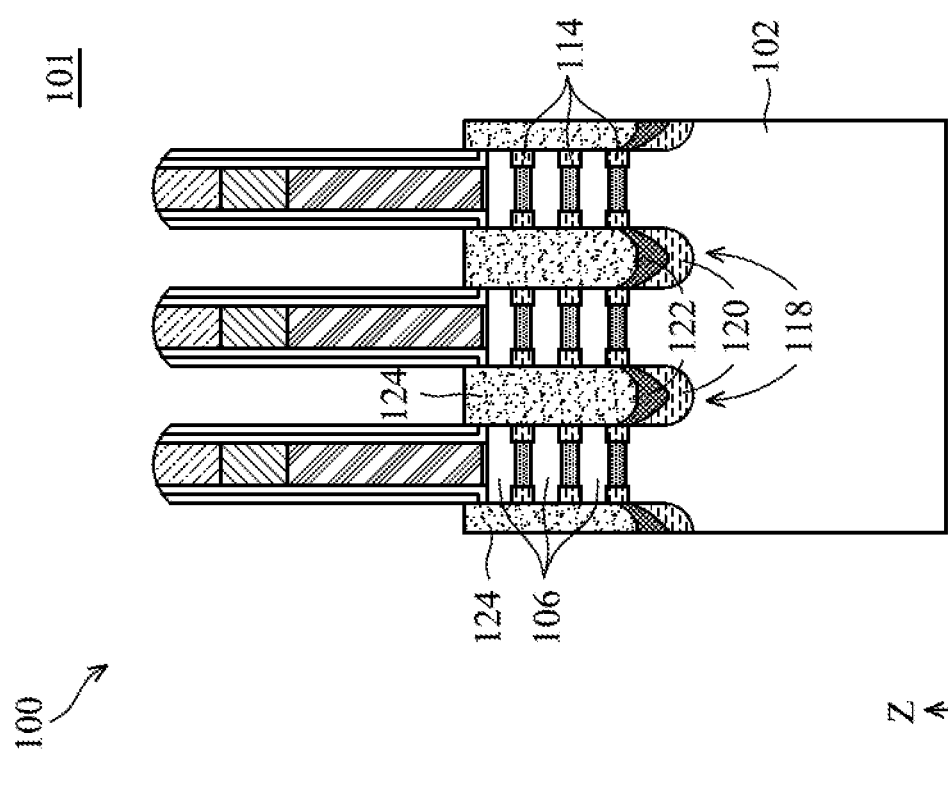

FIG. 2O is an X-view of the integrated circuit 100, in accordance with some embodiments. In FIG. 2O, an etching process has been performed to remove the dielectric layer 170. However, the thicker dielectric barrier structure 122 remains at the bottom of the trenches 162 due to its changed composition and its increased thickness relative to the other portions of the dielectric layer 170/172. Furthermore, a wet etch can be performed to remove the dielectric layer 170. This can improve the uniformity of the bottom isolation structure 118 by avoiding more dry etching.

In FIG. 2O, source/drain regions 124 have been formed in the trenches 162. The source/drain regions 124 can be formed by an epitaxial growth from the semiconductor nanostructures 106. The source/drain regions 124 include a semiconductor material. The semiconductor material can include a same semiconductor material as the semiconductor nanostructures 106. Alternatively, the semiconductor material of the source/drain regions 124 can be different than the semiconductor material of the semiconductor nanostructures 106. The source/drain regions 124 may be doped in situ with dopant atoms during the epitaxial growth process. For example, the source/drain regions 124 may be doped with N-type dopant atoms in the regions at which N-type transistors are formed. The source/drain regions 124 may be doped with P-type dopant atoms in the regions at which P-type transistors are formed.

The source/drain regions 124 are positioned directly on top of the bottom isolation structures 118. More particularly, the source/drain regions 124 are positioned directly on top of the dielectric barrier structures 122 at the bottom of the source/drain trenches 162. Bottom isolation structures 118 help ensure that leakage currents do not flow between the source/drain regions 124 and the semiconductor substrate 102.

FIG. 2P is a Y-view of the integrated circuit 100 of FIG. 2O, in accordance with some embodiments. FIG. 2P illustrates that the source/drain regions 124 are grown between pairs of sidewall spacers 130. The lateral width of the source/drain regions 124 in the Y-direction is bounded by the sidewall spacers 130, aside from the small portion of the source/drain regions 124 that grow higher than the sidewall spacers 130. Because the sidewall spacers 130 have a height D3 that is relatively high above the shallow trench isolation regions 104, the lateral growth of the source/drain regions 124 is significantly limited. This helps ensure that the source/drain regions 124 of transistors 103 that are adjacent to each other in the Y-direction, will not contact each other. Accordingly, an undesirable contact and short-circuiting is prevented by the relatively tall sidewall spacers 130.

In some embodiments, the source/drain regions 124 have a lateral dimension D4 between the sidewall spacers 130. The lateral dimension D4 may be between 5 nm and 15 nm. The source/drain regions 124 extends above the sidewall spacers 130 with a dimension D6. The dimension D6 may be between 3 nm and 15 nm. The source/drain regions 124 also have a maximum lateral dimension D5 above the sidewall spacers 130. The maximum lateral dimension D5 is between 8 nm and 20 nm. The maximum lateral dimension D5 does not extend beyond the outer portions of the sidewall spacers 130. This ensures that bridging will not occur between adjacent source/drain regions 124. Source/drain regions 124 and sidewall spacers 130 having dimensions the fault of the ranges described above are likely to ensure that no bridging occurs. Other dimensions and configurations of sidewall spacers 130 and source/drain regions 124 can be utilized without departing from the scope of the present disclosure.

The bottom isolation structures 118 extend a dimension D7 below the top surface of the shallow trench isolation region. D7 may have a value between 5 nm and 15 nm. Depths in this range may be sufficient to ensure leakage currents are effectively blocked. Other depth values can be utilized without departing from the scope of the present disclosure. Utilization of the sidewall spacers may allow for design scaling such that the bottoms of adjacent source/drain regions may be between 15 nm and 80 nm apart, though other values can also be utilized.

In some embodiments, the transistors 103 shown in relation to FIGS. 1A-2P are N-type transistors. The process for forming the N-type transistors 103 can also be utilized to form P-type transistors substantially simultaneously.

FIGS. 2Q and 2R illustrate a region 105 of the integrated circuit 100 corresponding to regions of P-type transistors. FIG. 2Q is an X-view of the integrated circuit 100 at the region 105. FIG. 2R is a Y-view of the integrated circuit 100 at the region 105. The region 105 also includes semiconductor nanostructures 180 corresponding to channel regions of P-type transistors. The semiconductor nanostructures 180 may be substantially identical to the semiconductor nanostructures 106 of the transistors 103 of the region 101. The region 105 includes inner spacers 114, bottom isolation structures 118, dummy gate structures 148, sidewall spacers 130, shallow trench isolation regions 104, and a substrate 102 substantially identical to the analogous structures described in relation to the region 101 of the integrated circuit 100.

The regions 105 includes source/drain regions 182. The source/drain regions 182 are substantially identical to the source/drain regions 124 except that they are doped with an offset type dopant. For example, if the source/drain regions 124 are doped with N-type dopant atoms, then the source/drain regions 182 are doped with P-type dopant atoms. Dimensions and materials of the source/drain regions 182 may be substantially identical to the dimensions and materials of the source/drain regions 124. Accordingly, the P-type transistors of the region 105 are protected by sidewall spacers 130b and bottom isolation structures 118 as described in relation to the transistors of the region 101.

FIG. 2S is an X-view of the integrated circuit 100, in accordance with some embodiments. In FIG. 2S, processing of the transistors 103 is substantially complete. The transistors 103 of FIG. 2S correspond to the transistors 103 of FIG. 1A. The polysilicon layer 154 and the dielectric layers 156 and 158 of the dummy gate structures 148 have been removed. After removal of the polysilicon layer, the sacrificial semiconductor nanostructures 163 are removed with an etching process that selectively removes the sacrificial semiconductor nanostructures 163 with respect to the semiconductor nanostructures 106.

After removal of the sacrificial semiconductor nanostructures 163, a gap remains where the sacrificial semiconductor nanostructures 163 were. The semiconductor nanostructures 106 are exposed. A gate dielectric layer (not shown) is deposited surrounding the semiconductor nanostructures 106. The gate dielectric layer may include an interfacial dielectric layer and the high K dielectric layer. The interfacial dielectric layer may include silicon oxide of a thickness between 2 Å and 10 Å. The high K dielectric layer is deposited on the interfacial dielectric layer and may include hafnium oxide. The high K dielectric layer may have a thickness between 5 Å and 20 Å. The materials of the gate dielectric layer may be deposited by ALD, CVD, or PVD. Other structures, materials, thicknesses, and deposition processes may be utilized for the gate dielectric layer without departing from the scope of the present closure.

After deposition of the gate dielectric layer around the semiconductor nanostructures 106, gate electrodes 108 are formed. The gate electrode 108 can include gate metals 110 and 112 as described in relation to FIG. 1A. The gate electrode 108 can be deposited by ALD, PVD, or CVD. The gate electrode 108 fills all remaining spaces around the semiconductor nanostructures 106 and fills the remaining spaces vacated by removal of the polysilicon layer 154. Other materials, thicknesses, deposition processes, and structures can be utilized for the gate electrodes 108 without departing from the scope of the present disclosure.

In FIG. 2S, a thin dielectric layer 138 has been deposited covering the source/drain regions 124, the sidewall spacers 130b, and exposed portions of the dielectric layer 122 between adjacent source/drain regions 124. The dielectric layer 138 may include one or more of silicon oxide, silicon nitride, silicon oxynitride, silicon carbonitride, silicon oxycarbonitride, fluorine-doped silicate glass (FSG), a low-K dielectric material or other dielectric materials. The dielectric layer 138 may be deposited by CVD, PVD, or ALD. An interlevel dielectric layer 140 has been deposited covering the dielectric layer 138. The interlevel dielectric layer 140 can include one or more of silicon oxide, silicon nitride, silicon oxynitride, silicon carbonitride, silicon oxycarbonitride, fluorine-doped silicate glass (FSG), a low-K dielectric material or other dielectric materials. The interlevel dielectric layer can be deposited by CVD, PVD, or ALD. Other materials and dimensions can be utilized for the dielectric layers 138 and 140 without departing from the scope of the present disclosure.

Though not shown in FIG. 2S, source/drain contacts can be formed to electrically contact the source/drain regions 124 through the dielectric layers 138 and 140. The source/drain contacts can include a silicide in contact with the source/drain regions 124 and one or more metals in contact with the silicide.

FIG. 2T is a Y-view of the integrated circuit 100, in accordance with some embodiments. The Y-view of FIG. 2T is substantially similar to the Y-view of FIG. 1B.

FIG. 2U is an X-view of the integrated circuit 100, in accordance with some embodiments. FIG. 2V is a Y-view of the integrated circuit 100 of FIG. 2U, in accordance with some embodiments. FIGS. 2U and 2V illustrate the region 105 at which P-type transistors 184 have been formed. The P-type transistors 184 include semiconductor nanostructures 180, source/drain regions 182, gate electrodes 186, sidewall spacers 130a/b, and bottom isolation structures 118 substantially as described in relation to the analogous structures of the transistors 103. The gate electrodes 186 can include gate metals 188 and 190. The gate electrodes 186 can include the same metals or different metals as the gate electrodes 108 of the transistors 103.

Figure 3:
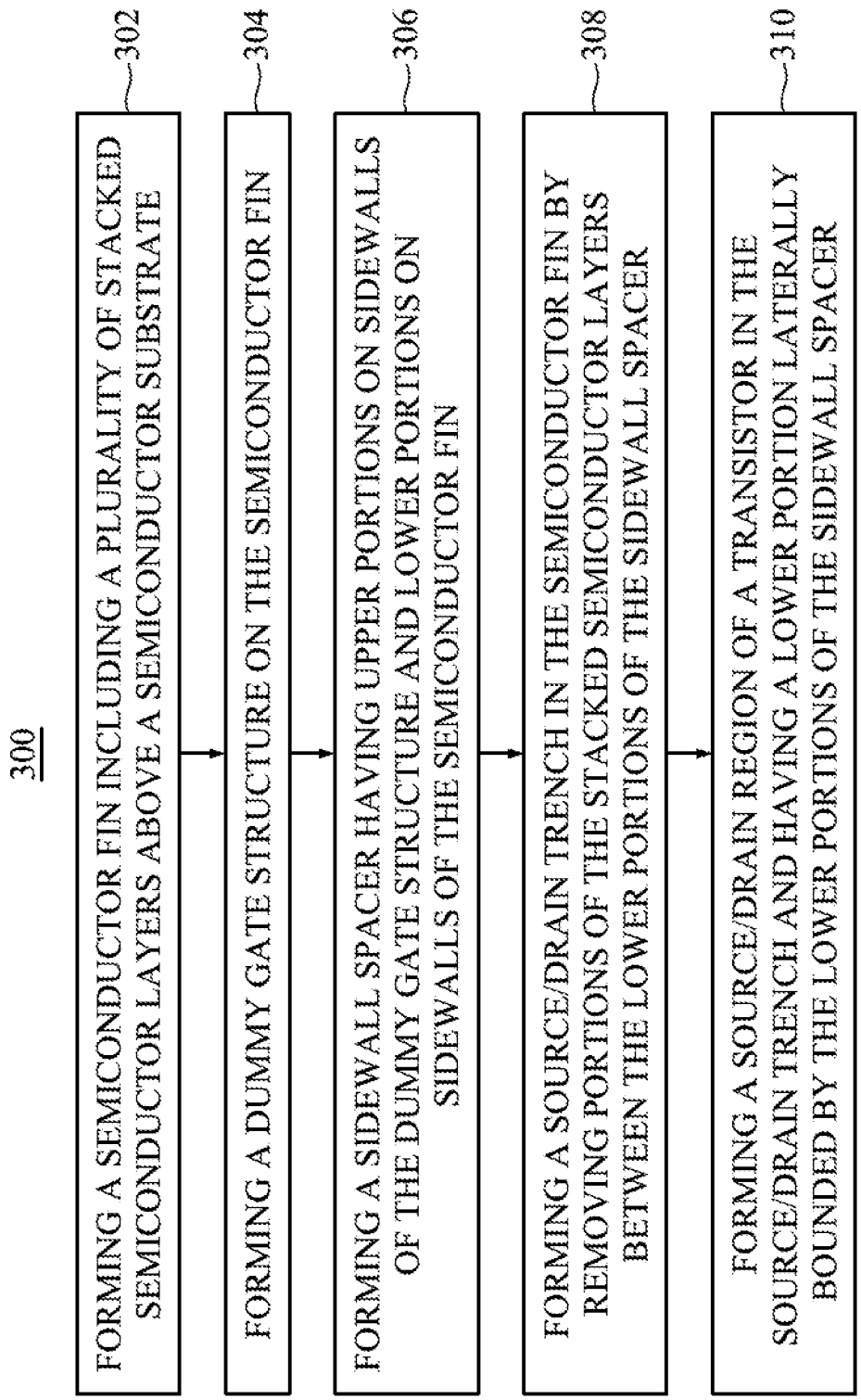
FIG. 3 is a flow diagram of a process for forming an integrated circuit, in accordance with some embodiments.

FIG. 3 is a flow diagram of a method 300 for forming an integrated circuit, in accordance with some embodiments. The method 300 can utilize processes, structures, and components described in relation to FIGS. 1A-2V. At 302, the method 300 includes forming a semiconductor fin including a plurality of stacked semiconductor layers above a semiconductor substrate. One example of a semiconductor fin is the semiconductor fin 146 of FIG. 1B. One example of stacked semiconductor layers are the stacked semiconductor layers 142 of FIG. 1B. One example of a semiconductor substrate is the semiconductor substrate 102 of FIG. 1B. At 304, the method 300 includes forming a dummy gate structure on the semiconductor fin. One example of a dummy gate structure is the dummy gate structure 148 of FIG. 2C. At 306, the method 300 includes forming a sidewall spacer having upper portions on sidewalls of the dummy gate structure and lower portions on sidewalls of the semiconductor fin. One example of a sidewall spacers the sidewall spacers 130 of FIG. 2E. One example of an upper portion is the sidewall spacer 130a of FIG. 2G. One example of lower portions is the sidewall spacers 130b FIG. 2H. At 308, the method 300 includes forming a source/drain trench in the semiconductor fin by removing portions of the stacked semiconductor layers between the lower portions of the sidewall spacer. One example of a source/drain trench is the source/drain trench 162 of FIG. 2H. At 310, the method 300 includes forming a source/drain region of a transistor in the source/drain trench and having a lower portion laterally bounded by the second portions of the sidewall spacer. One example of a source/drain region is the source/drain region 124 of FIG. 2P.

Embodiments of the present disclosure provide an integrated circuit with nanostructure transistors having reduced source/drain leakage currents. The semiconductor nanostructure transistors include bottom dielectric barrier structures for reducing leakage from source/drain regions to the substrate. The semiconductor nanostructure transistors also utilize fin sidewall spacers for limiting lateral growth during source/drain epitaxial growth, thereby reducing the risk that adjacent source/drain regions can contact each other due to lateral overgrowth.

Reducing leakage currents and unwanted bridging between adjacent source/drain regions has several benefits. For example, transistors will consume less power as leakage currents are reduced. Furthermore, the prevention of source/drain bridging will result in better functioning integrated circuits and overall higher wafer yields.

In some embodiments, an integrated circuit includes a semiconductor substrate, a shallow trench isolation region in the semiconductor substrate, a plurality of stacked first semiconductor nanostructures above the semiconductor substrate and corresponding to channel regions of a first transistor, and a first source/drain region in contact with the first semiconductor nanostructures. The integrated circuit includes a first gate electrode over the first semiconductor nanostructures, a first sidewall spacer above the first semiconductor nanostructures and laterally bounding the first gate electrode, and a second sidewall spacer of a same material as the first sidewall spacer on the shallow trench isolation region and laterally bounding a lower portion of the first source/drain region.

In some embodiments, a method includes forming a semiconductor fin including a plurality of stacked semiconductor layers above a semiconductor substrate, forming a dummy gate structure on the semiconductor fin, and forming a sidewall spacer having upper portions on sidewalls of the dummy gate structure and lower portions on sidewalls of the semiconductor fin. The method includes forming a source/drain trench in the semiconductor fin by removing portions of the stacked semiconductor layers between the lower portions of the sidewall spacer and forming a source/drain region of a transistor in the source/drain trench and having a lower portion laterally bounded by the lower portions of the sidewall spacer.

In some embodiments, an integrated circuit includes an integrated circuit. The integrated circuit includes a semiconductor fin including a semiconductor substrate and a channel region of a transistor over the semiconductor substrate, a shallow trench isolation region in the semiconductor substrate, and a source/drain region in the semiconductor fin and in contact with the channel region. The integrated circuit includes a dielectric bottom isolation region between the source/drain region and the semiconductor substrate and electrically isolating the source/drain region from the semiconductor substrate and a fin sidewall spacer on the shallow trench isolation region extending between 5 nm and 30 nm above the shallow trench isolation region and laterally bounding a lower portion of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor fin including a plurality of stacked semiconductor layers above a semiconductor substrate;
    forming a dummy gate structure on the semiconductor fin;
    forming a sidewall spacer having upper portions on sidewalls of the dummy gate structure and lower portions on sidewalls of the semiconductor fin;
    forming a source/drain trench in the semiconductor fin by removing portions of the stacked semiconductor layers between the lower portions of the sidewall spacer, wherein forming the source/drain trench includes defining, from the plurality of stacked semiconductor layers, a plurality of stacked semiconductor nanostructures corresponding to channel regions of the transistor;
    forming recesses in sacrificial semiconductor layers between the stacked semiconductor layers;
    depositing a first dielectric layer on sidewalls of the source/drain trench, in the recesses, and in contact with the semiconductor substrate at a bottom of the source/drain trench;
    defining, from the first dielectric layer, inner spacers of the transistor and a first dielectric barrier structure at a bottom of the source/drain trench by removing the first dielectric layer from the sidewalls of the source/drain trench but not from the recesses or from the bottom of the source/drain trench;
    forming a source/drain region of a transistor in the source/drain trench over the first dielectric barrier structure and having a lower portion laterally bounded by the lower portions of the sidewall spacer, wherein the first dielectric barrier structure electrically isolates the source/drain region from the semiconductor substrate, wherein the source/drain trench extends below a top surface of a shallow trench isolation region, wherein the first dielectric barrier structure is lower than the top surface of the shallow trench isolation region;
    removing the dummy gate structure; and
    forming a gate electrode of the transistor having an upper portion laterally bounded by the upper portions of the sidewall spacer.

2. The method of claim 1, comprising:
    depositing, after defining the inner spacers and prior to forming the source/drain region, a second dielectric layer on sidewalls of the source/drain trench and in contact with the first dielectric barrier structure at the bottom of the source/drain trench;
    defining, from the second dielectric layer, a second dielectric barrier structure on the first dielectric barrier structure by removing the second dielectric layer from the sidewalls of the source/drain trench; and
    forming the source/drain region in contact with the second dielectric barrier structure, wherein the first and second dielectric barrier structures electrically isolates the source/drain region from the semiconductor substrate.

3. The method of claim 2, comprising:
    prior to removing the second dielectric layer from the sidewalls of the source/drain trench, changing a composition of the second dielectric layer at the bottom of the source/drain trench by implanting atoms into the second dielectric layer at the bottom of the source/drain trench; and
    removing the second dielectric layer by performing an etching process that selectively etches the second dielectric layer from the sidewalls of the source/drain trench with respect to the changed composition at the bottom of the source/drain trench.

4. The method of claim 1, wherein the first dielectric barrier structure is selectively etchable with respect to the sidewall spacer.

5. The method of claim 1, comprising forming an interlevel dielectric layer over the source/drain region.

6. A method, comprising:
    forming a semiconductor fin including a plurality of stacked semiconductor layers above a semiconductor substrate;
    forming a shallow trench isolation region in the semiconductor substrate adjacent to the semiconductor fin;
    forming, from the plurality of stacked semiconductor layers, a plurality of stacked first semiconductor nanostructures above the semiconductor substrate and corresponding to channel regions of a first transistor by forming a source/drain trench in the semiconductor fin;
    forming recesses in sacrificial semiconductor layers between the stacked first semiconductor nanostructures;
    depositing a first dielectric layer on sidewalls of the source/drain trench, in the recesses, and in contact with the semiconductor substrate at a bottom of the source/drain trench;

defining, from the first dielectric layer, inner spacers of the first transistor and a first bottom isolation structure at a bottom of the source/drain trench by removing the first dielectric layer from the sidewalls of the source/drain trench but not from the recesses or from the bottom of the source/drain trench;

depositing, after defining the inner spacers, a second dielectric layer on sidewalls of the source/drain trench and in contact with the first bottom isolation structure at the bottom of the source/drain trench;

defining, from the second dielectric layer, a second bottom isolation structure on the first bottom isolation structure by removing the second dielectric layer from the sidewalls of the source/drain trench;

forming a first source/drain region in contact with the semiconductor nanostructures above and in contact with the second dielectric barrier structure, wherein the first and second dielectric barrier structures electrically isolates the first source/drain region from the semiconductor substrate; and forming a first gate electrode over the first semiconductor nanostructures, wherein a first sidewall spacer is above the first semiconductor nanostructures and laterally bounds the gate electrode, wherein a second sidewall spacer of a same material as the first sidewall spacer is on the shallow trench isolation region and laterally bounds a lower portion of the first source/drain region.

7. The method of claim 6, wherein the second sidewall spacer has a height greater than 5 nm above the shallow trench isolation region.

8. The method of claim 6, wherein a material of the inner spacers is selectively etchable with respect to a material of the second sidewall spacer.

9. The method of claim 6, wherein the first bottom isolation structure extends lower than a top surface of the shallow trench isolation region.

10. The method of claim 6, wherein the first source/drain region includes an upper portion that extends above the second sidewall spacer and has a lateral width larger than a lateral width of the lower portion of the first source/drain region.

11. The method of claim 6, comprising:
forming a plurality of stacked second semiconductor nanostructures above the semiconductor substrate and corresponding to channel regions of a second transistor;
forming a second source/drain region in contact with the second semiconductor nanostructures;
forming a second gate electrode over the second semiconductor nanostructures;
forming a third sidewall spacer above the second semiconductor nanostructures and laterally bounding the second gate electrode; and
forming a fourth sidewall spacer on the shallow trench isolation region and laterally bounding a lower portion of the second source/drain region.

12. The method of claim 11, comprising forming an interlevel dielectric layer over the first and second source/drain regions and extending between the second sidewall spacer and the third sidewall spacer.

13. A method, comprising:
forming a semiconductor fin including a semiconductor substrate and a channel region of a transistor over the semiconductor substrate;
forming a shallow trench isolation region in the semiconductor substrate;
forming a source/drain region in the semiconductor fin and in contact with the channel region;
forming a dielectric bottom isolation region between the source/drain region and the semiconductor substrate and electrically isolating the source/drain region from the semiconductor substrate; and
forming a fin sidewall spacer on the shallow trench isolation region extending between 5 nm and 30 nm above the shallow trench isolation region and laterally bounding a lower portion of the source/drain region, wherein the dielectric bottom isolation region includes:
a first dielectric barrier structure in contact with the semiconductor substrate; and
a second dielectric barrier structure on the first dielectric barrier structure and in contact with the semiconductor substrate.

14. The method of claim 13, wherein the first dielectric barrier structure is selectively etchable with respect to the fin sidewall spacer.

15. The method of claim 13, wherein the first and second dielectric barrier structures are concave.

16. The method of claim 13, further comprising a gate electrode of the transistor above the channel.

17. The method of claim 16, further comprising forming gate sidewall spacer, wherein an upper portion of the gate electrode is laterally bounded by the gate sidewall spacer.

18. The method of claim 17, wherein the fin sidewall spacer and the gate sidewall spacer are a same material.

19. The method of claim 13, wherein the first dielectric barrier structure extends lower than a top surface of the shallow trench isolation region.

20. The method of claim 13, comprising forming an interlevel dielectric layer over the source/drain region.

* * * * *